(12) United States Patent  
Hirler

(10) Patent No.: US 7,858,478 B2  
(45) Date of Patent: Dec. 28, 2010

(54) METHOD FOR PRODUCING AN INTEGRATED CIRCUIT INCLUDING A TRENCH TRANSISTOR AND INTEGRATED CIRCUIT

(75) Inventor: Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 12/711,127

(22) Filed: Feb. 23, 2010

(65) Prior Publication Data

US 2010/0151643 A1  Jun. 17, 2010

Related U.S. Application Data

(62) Division of application No. 11/843,251, filed on Aug. 22, 2007, now abandoned.

(51) Int. Cl.
*H01L 21/336* (2006.01)
*H01L 21/339* (2006.01)
*H01L 21/00* (2006.01)

(52) U.S. Cl. .................. 438/270; 438/268; 438/371; 438/272; 438/156; 438/158; 438/209; 438/212; 257/302; 257/397; 257/E27.096

(58) Field of Classification Search ................ 438/268, 438/270, 271, 272, 156, 158, 209, 212; 257/302, 257/397, E27.096
See application file for complete search history.

(56) References Cited

U.S. PATENT DOCUMENTS

| | | | |
|---|---|---|---|
| 5,258,634 A | 11/1993 | Yang | |
| 5,648,283 A * | 7/1997 | Tsang et al. | 438/138 |
| 6,160,288 A | 12/2000 | Yamada | |
| 6,465,843 B1 | 10/2002 | Hirler et al. | |
| 6,649,974 B2 | 11/2003 | Werner et al. | |
| 6,800,904 B2 | 10/2004 | Fujishima et al. | |
| 6,858,500 B2 | 2/2005 | Sugi et al. | |
| 7,202,525 B2 | 4/2007 | Kinzer | |
| 2001/0053568 A1* | 12/2001 | Deboy et al. | 438/138 |
| 2002/0135008 A1* | 9/2002 | Hirler | 257/302 |
| 2003/0085430 A1 | 5/2003 | Hao et al. | |
| 2004/0038467 A1 | 2/2004 | Darwish et al. | |
| 2004/0157384 A1* | 8/2004 | Blanchard | 438/197 |
| 2006/0049453 A1 | 3/2006 | Schmitz et al. | |

* cited by examiner

*Primary Examiner*—Ha Tran T Nguyen
*Assistant Examiner*—Karen M Kusumakar
(74) *Attorney, Agent, or Firm*—Dicke, Billig & Czaja, PLLC

(57) ABSTRACT

A method for producing an integrated circuit including a trench transistor and an integrated circuit is disclosed.

3 Claims, 16 Drawing Sheets

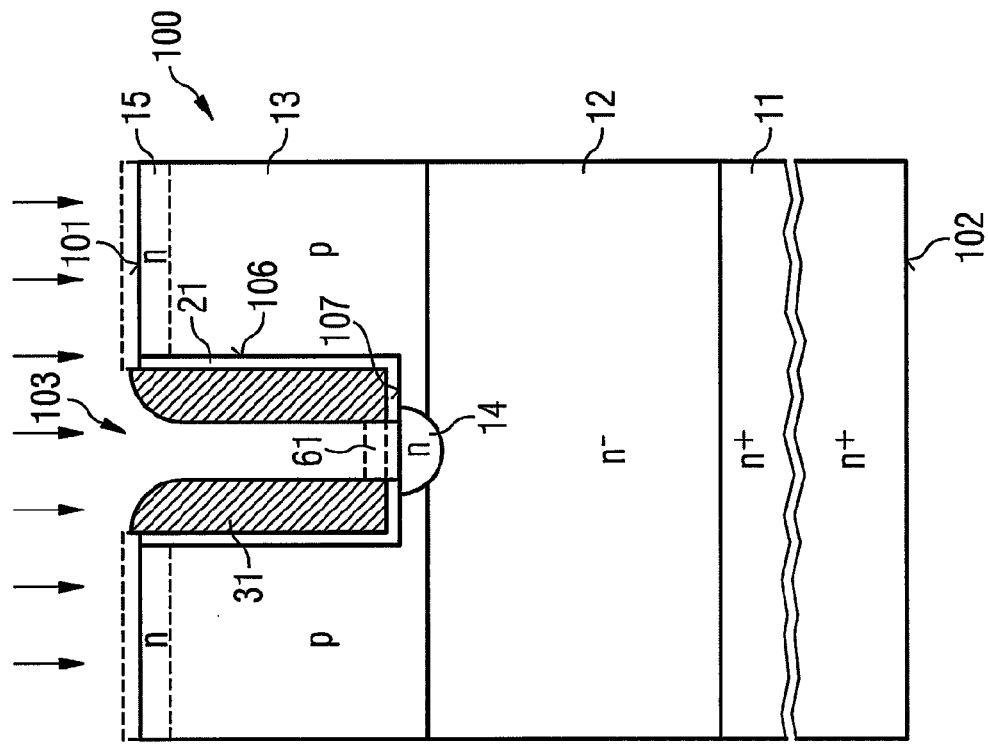
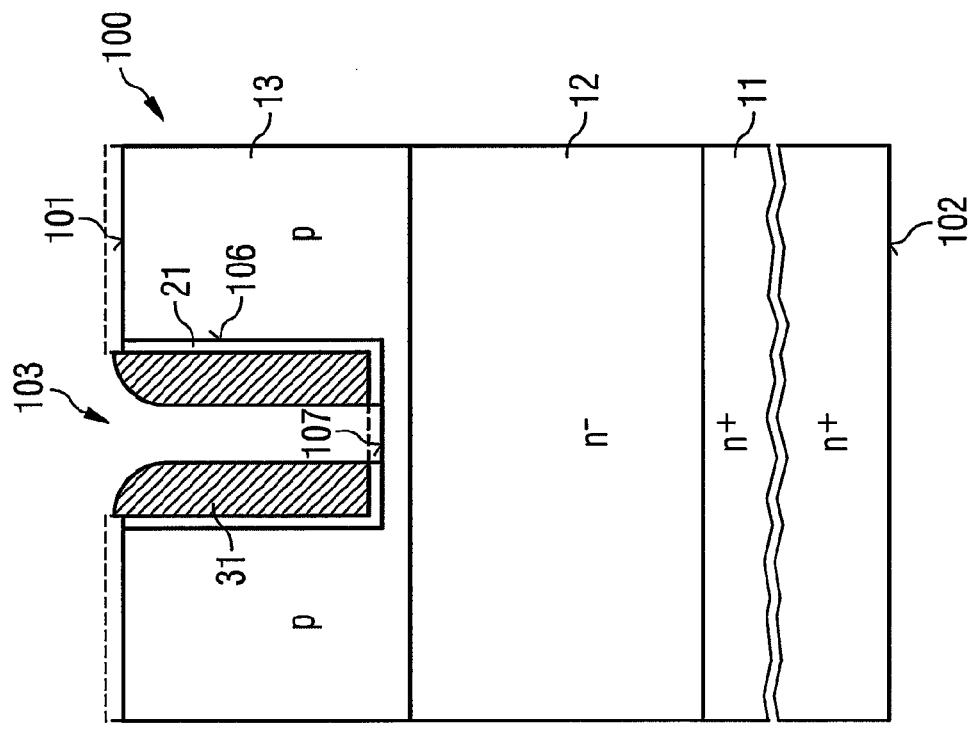

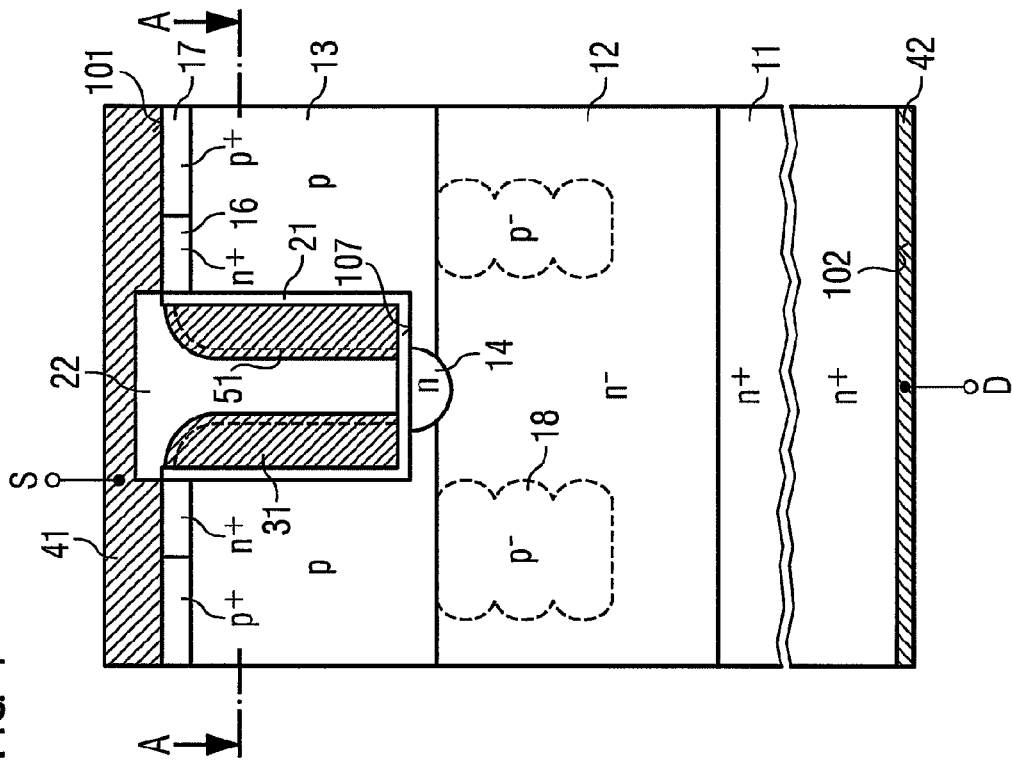
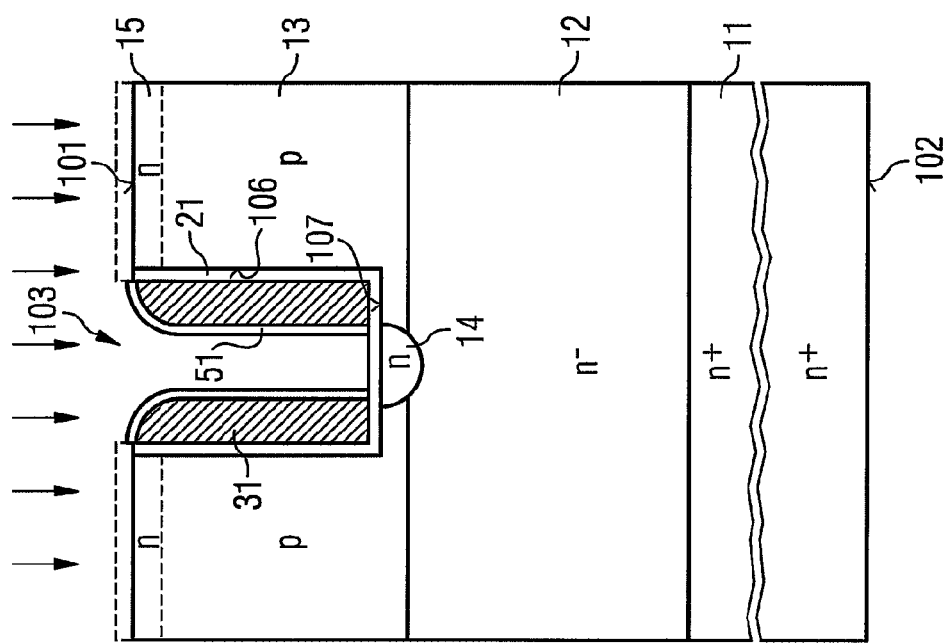

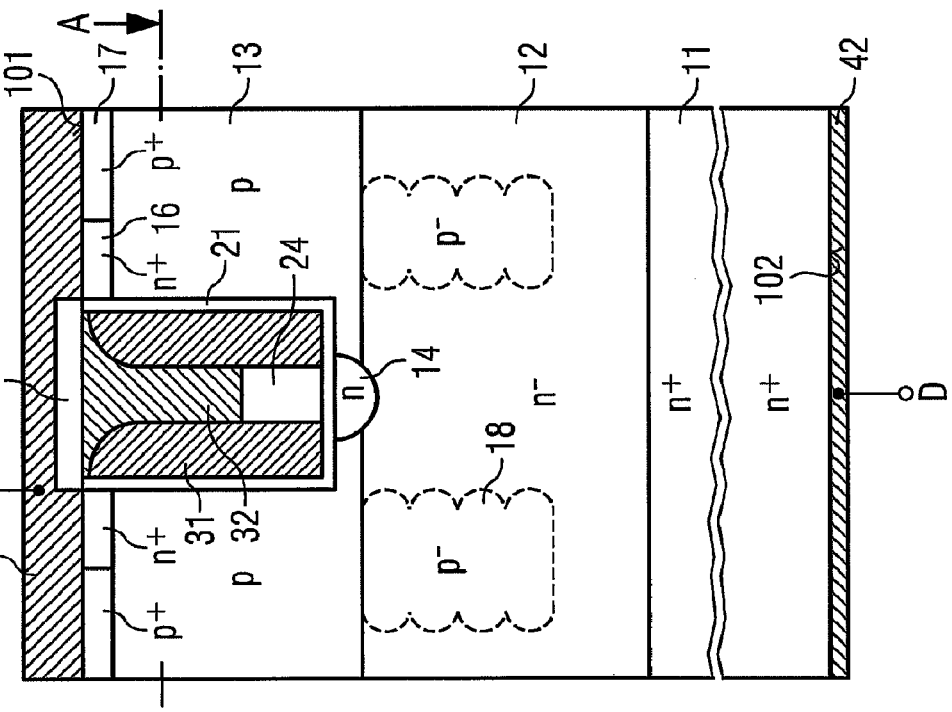
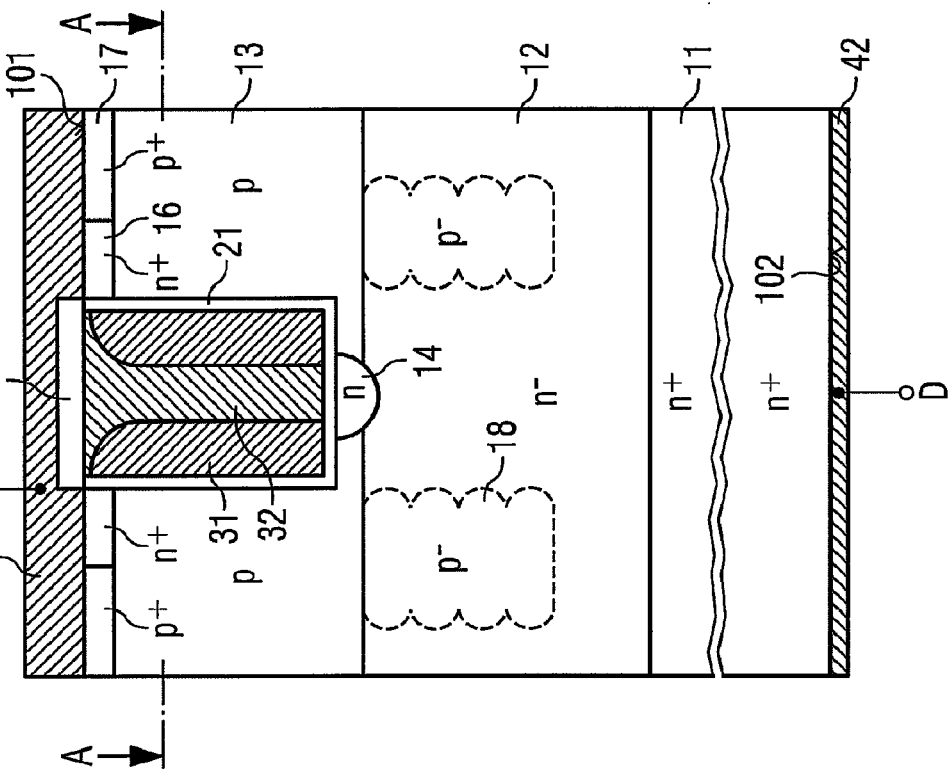

FIG 8A  A-A
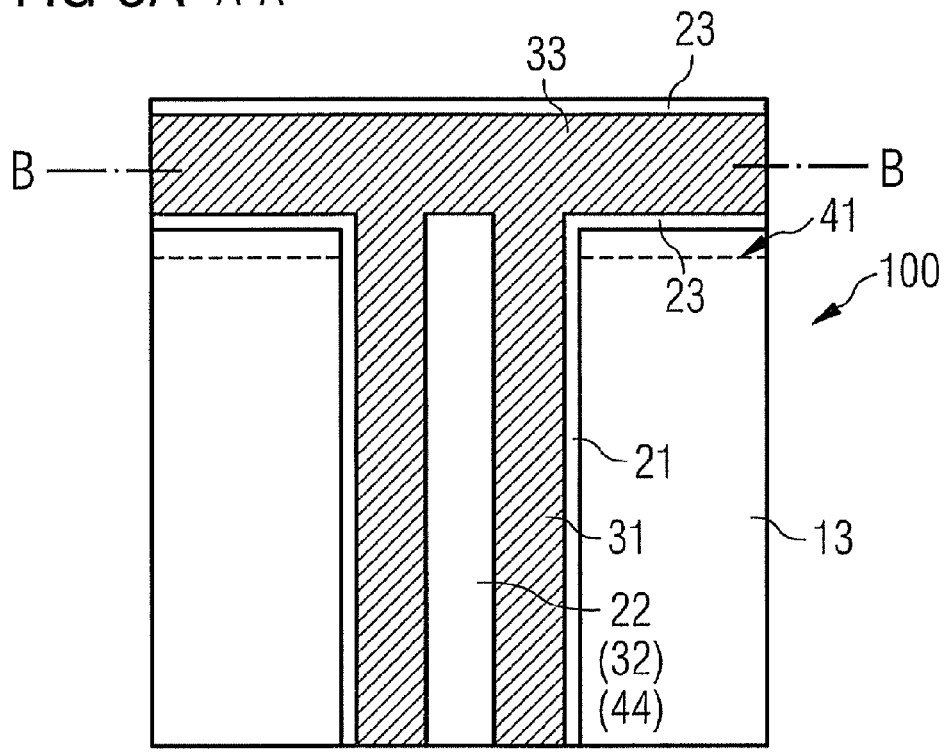
FIG 8B  B-B
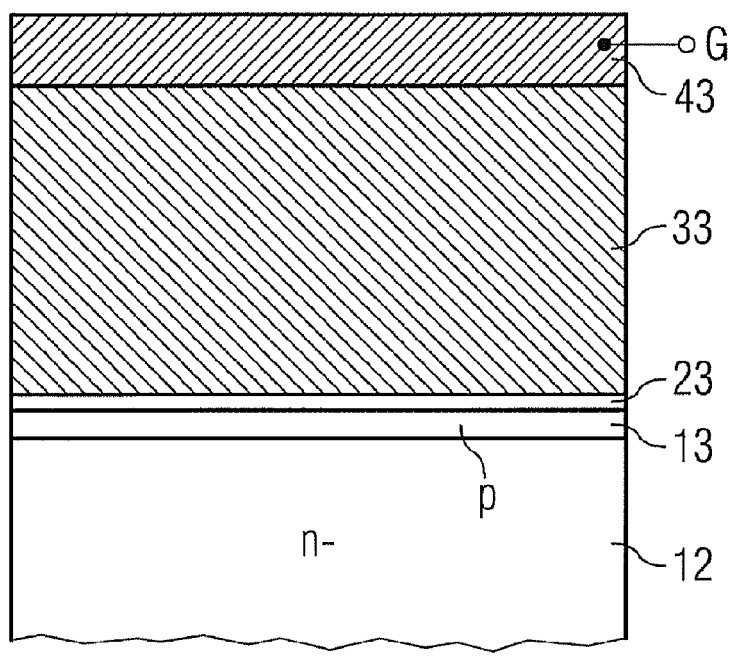

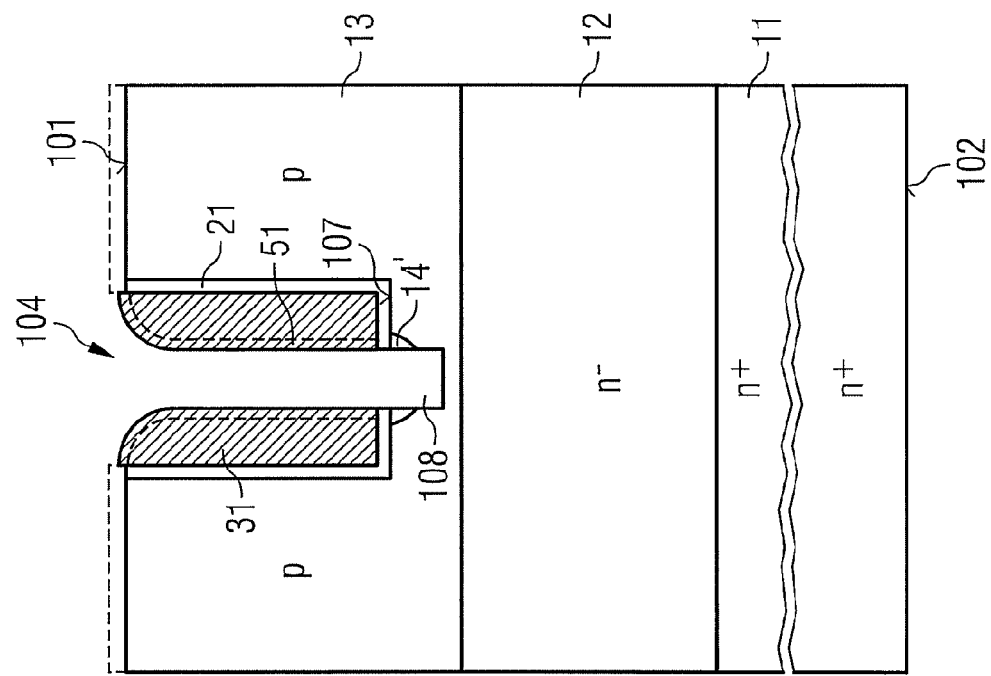
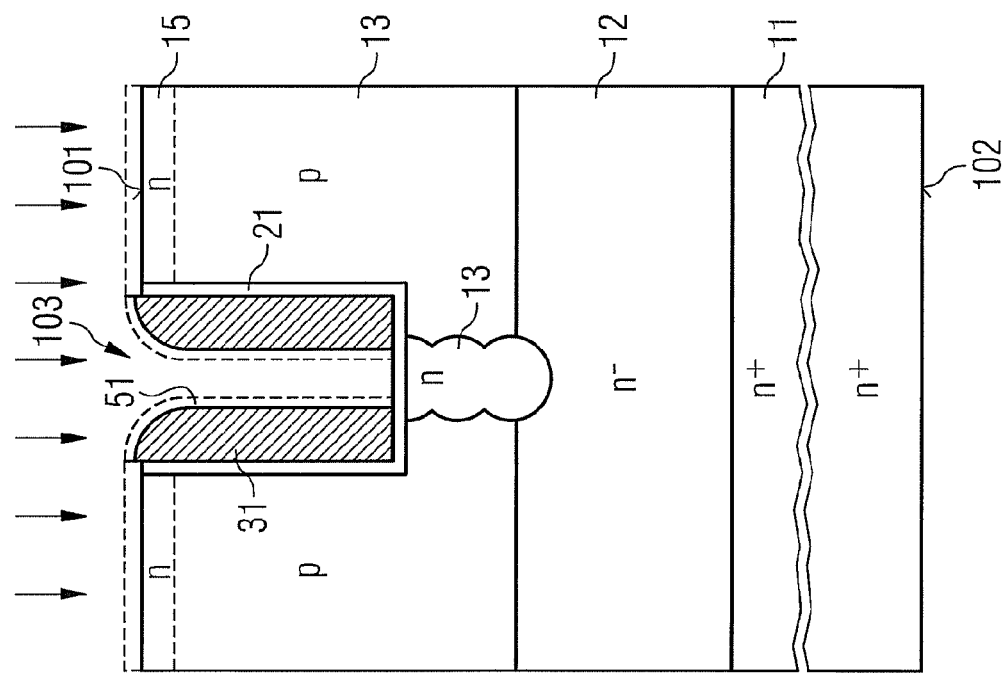

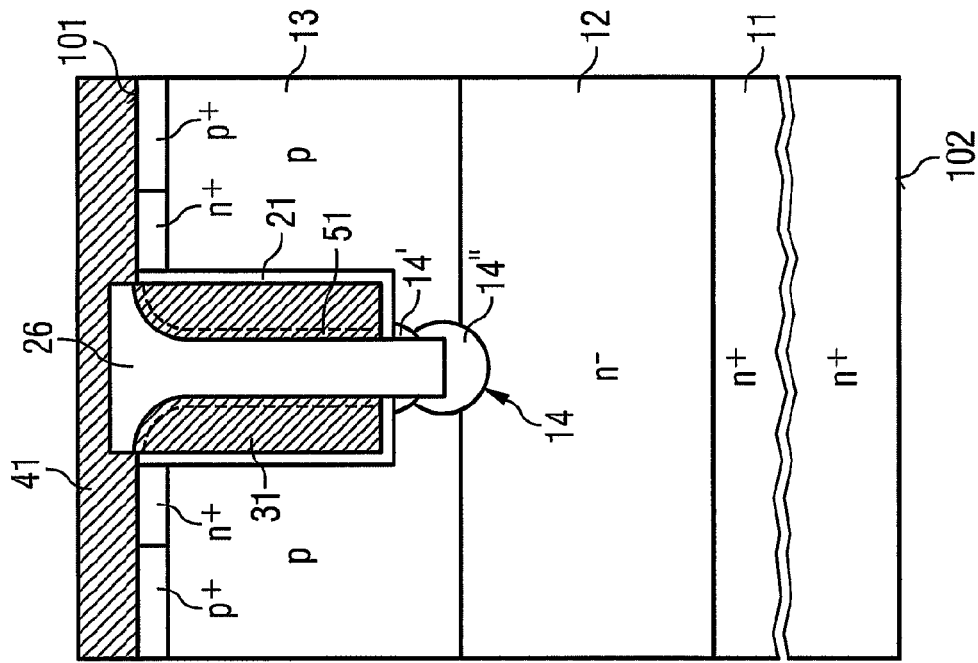
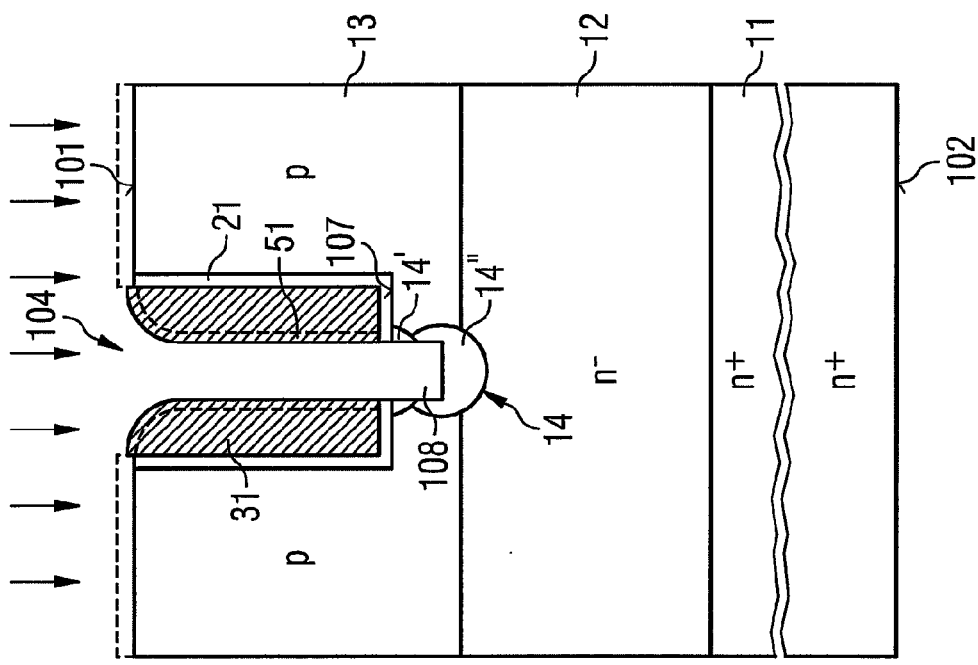

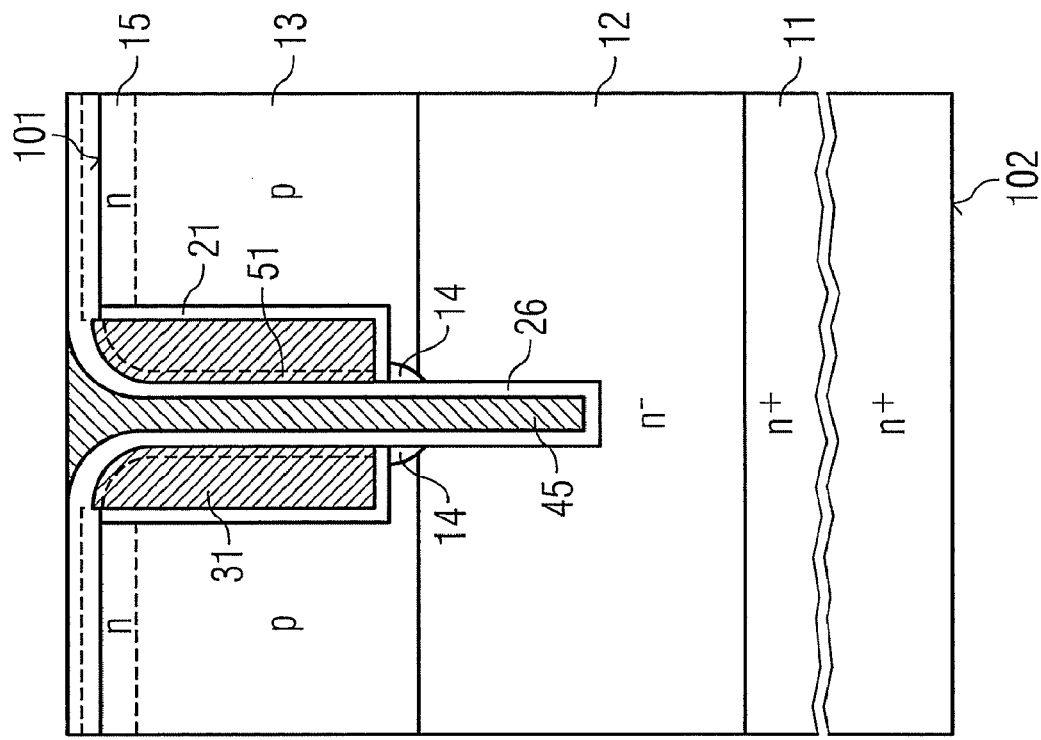
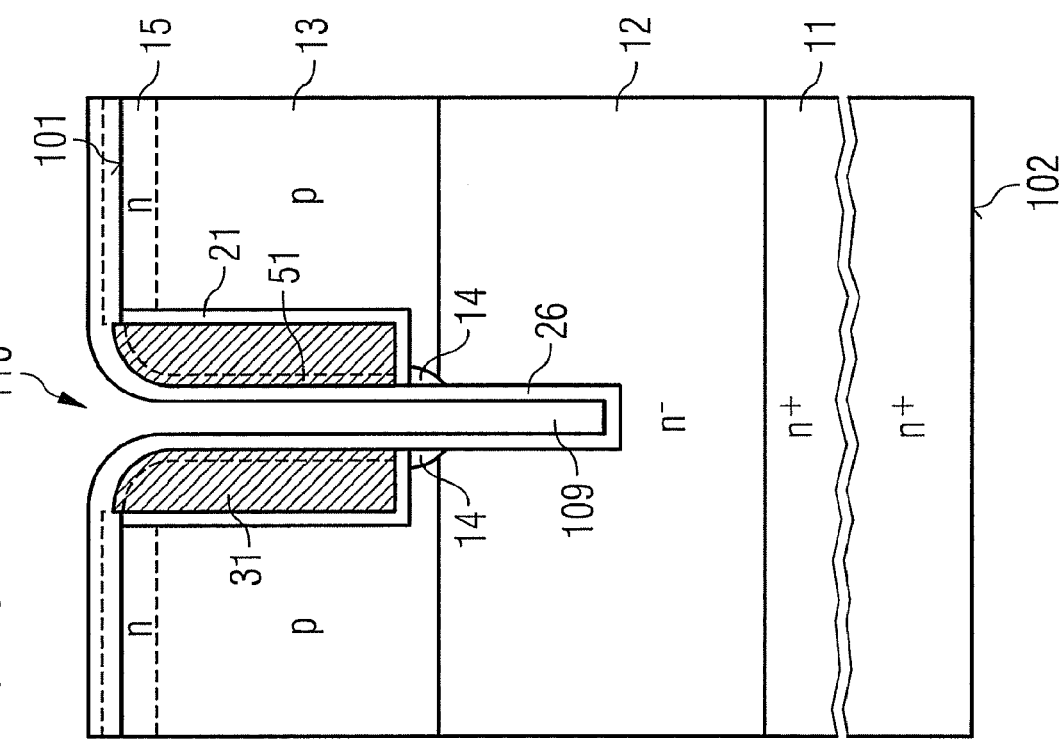

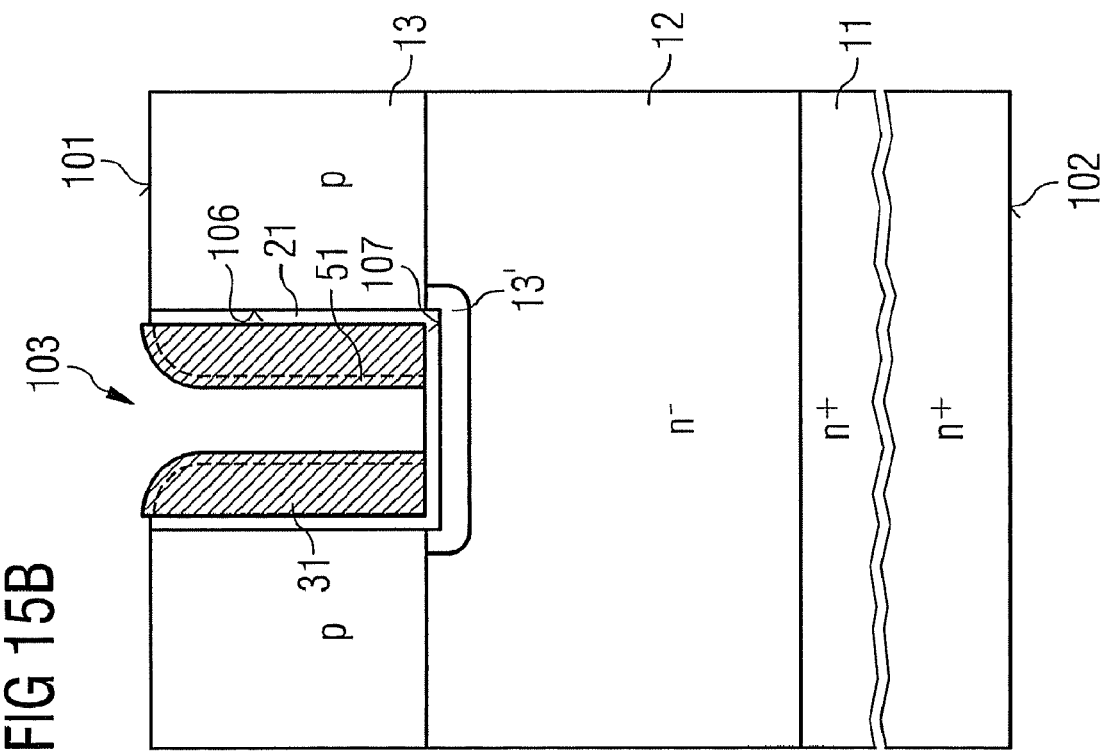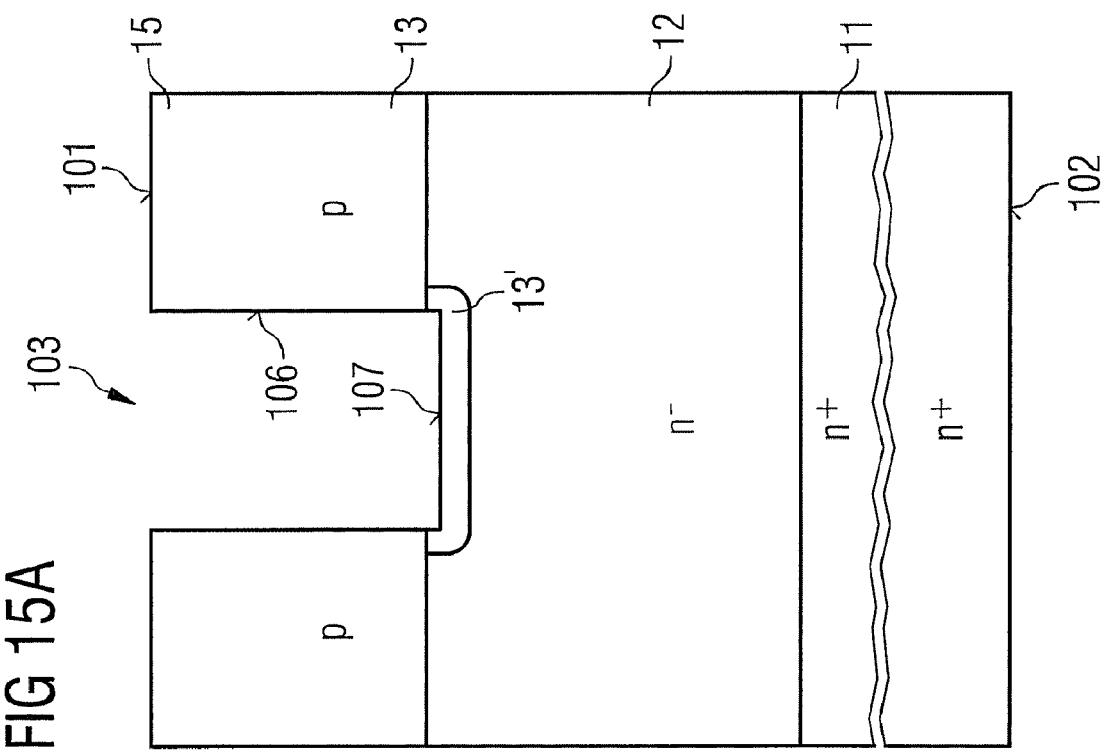

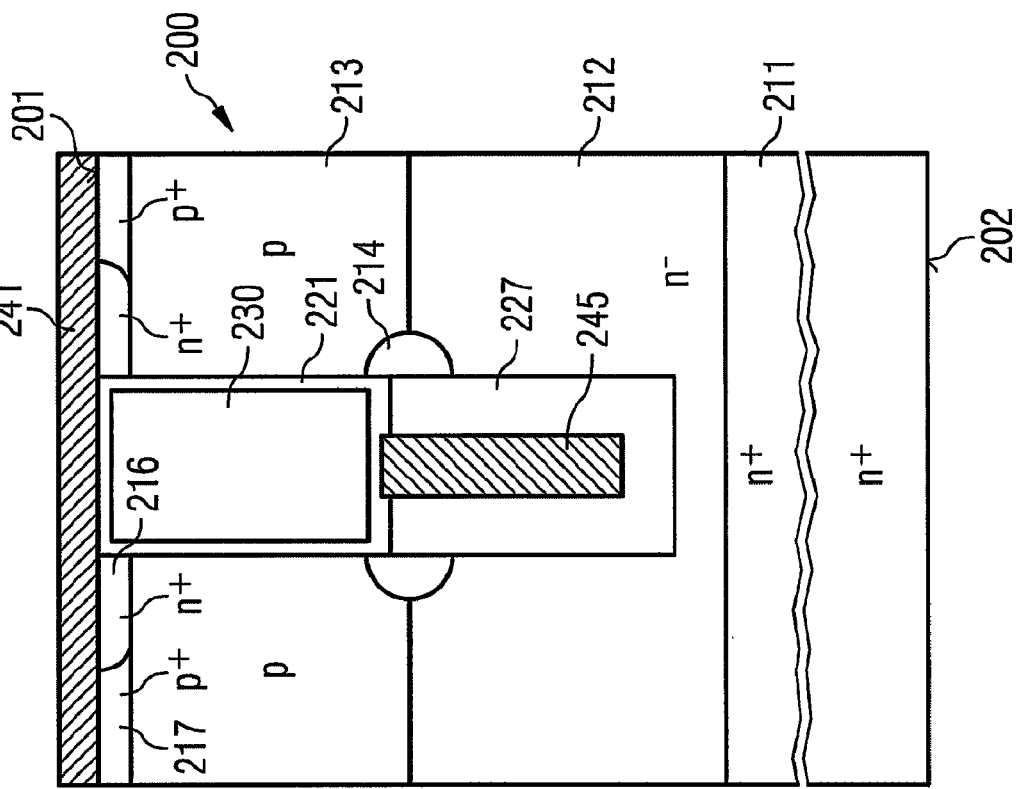
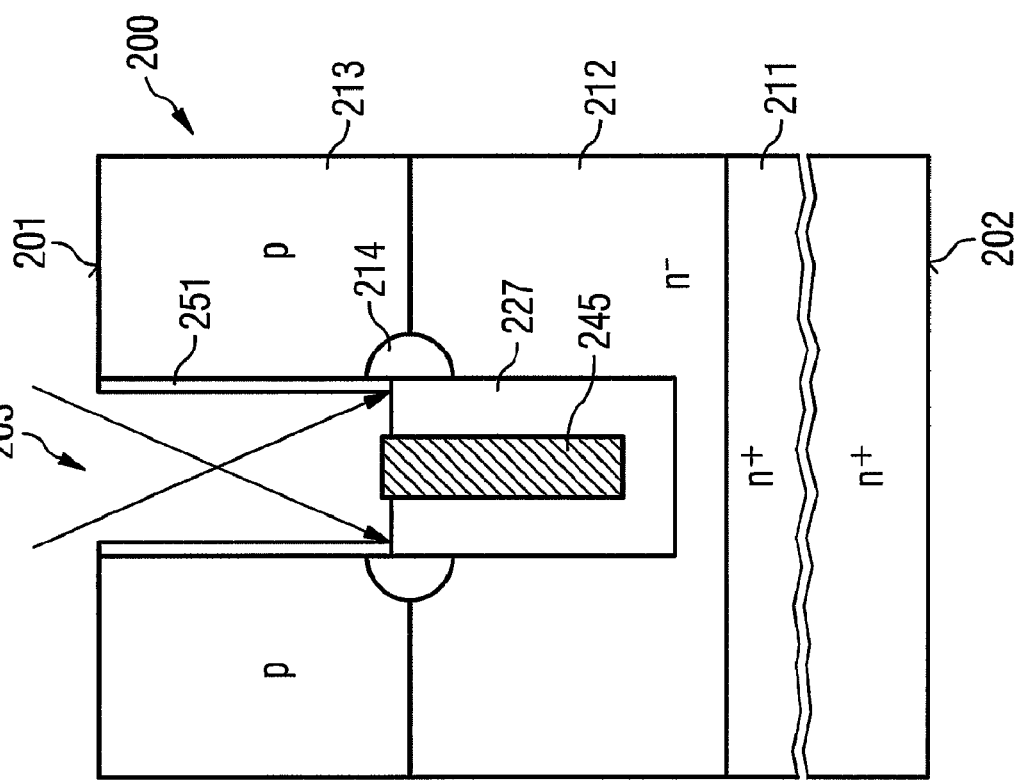

METHOD FOR PRODUCING AN INTEGRATED CIRCUIT INCLUDING A TRENCH TRANSISTOR AND INTEGRATED CIRCUIT

CROSS-REFERENCE TO RELATED APPLICATIONS

This Divisional Patent Application claims priority to U.S. patent application Ser. No. 11/843,251, filed on Aug. 22, 2007, which is incorporated herein by reference.

BACKGROUND

The invention relates to a method for producing a vertical trench transistor, and to a vertical trench transistor.

Trench transistors are sufficiently known. These are MOS transistors in which a gate electrode is arranged in a trench extending into a semiconductor body. In this case, the gate electrode is insulated from the semiconductor body by a gate dielectric layer and serves for controlling a conducting channel in a body zone arranged between a source zone and a drift zone/drain zone of the transistor.

The switch behavior of a MOS transistor is crucially influenced by the gate-drain capacitance, which is also referred to as Miller capacitance. The gate-drain capacitance is formed by sections of the gate electrode and of the drift zone/drain zone which mutually overlap, and a section of the gate dielectric which lies between the sections. In this case, a switching delay of the transistor upon a transition from a conducting to a blocking state, and vice versa, is shorter, the smaller the capacitance. Since the switching losses of a transistor increase as the switching delay increases, a rapidly switching transistor, that is to say a transistor having a smallest possible gate-drain capacitance, is desirable with regard to reducing the switching losses.

SUMMARY

One embodiment relates to a method for producing a trench transistor having a drift zone and a body zone adjacent to the drift zone, the method including: providing a semiconductor body having a first side and a first semiconductor zone of a first conduction type, producing a first trench, which has trench sidewalls and a trench bottom and which extends into the semiconductor body proceeding from the first side, producing at least one first spacer at the trench sidewalls which leaves free a section of the trench bottom, producing a second semiconductor zone of a second conduction type complementary to the first conduction type, which second semiconductor zone is adjacent to the first semiconductor zone in the direction of the first side of the semiconductor body and extends in the direction of the first semiconductor zone as far as below the trench bottom, and producing at least one third semiconductor zone of the first conduction type by introducing dopant atoms via the left-free section of the trench bottom, the first and the at least one third semiconductor zone forming the drift zone and the second semiconductor zone forming the body zone at least in sections.

Another embodiment relates to a method for producing a trench transistor having a drift zone and a body zone adjacent to the drift zone. This method provides for providing a semiconductor body having a first semiconductor zone of a first conduction type and a second semiconductor zone of a second semiconductor zone complementary to the first conduction type, the second semiconductor zone being adjacent to the first semiconductor zone in a vertical direction of the semiconductor body; producing a trench having trench sidewalls and a trench bottom and extending through the second semiconductor zone right into the first semiconductor zone; producing a further semiconductor zone of the second conduction type, which reaches along the first trench from the first semiconductor zone as far as the second semiconductor zone; producing spacer layers at the trench sidewalls which leave free a section of the trench bottom; and producing at least one third semiconductor zone of the first conduction type in a section of the second semiconductor zone which is arranged between the trench bottom and the first semiconductor zone, by introducing dopant atoms into the semiconductor body via the left-free section of the trench bottom. In this case, the first and the at least one third semiconductor zone form the drift zone, and the second and the further semiconductor zone of the second conduction type form the body zone at least in sections.

Another embodiment relates to a trench transistor, including: a semiconductor body, a drift zone of a first conduction type arranged in the semiconductor body, and a body zone of a second conduction type adjacent to the drift zone in a vertical direction of the semiconductor body, a gate electrode arranged in a first trench of the semiconductor body, the gate electrode being insulated from the semiconductor body by a gate dielectric layer. In this component, the drift zone has a first drift zone section, which is arranged at a distance from the trench, and a second drift zone section, which reaches from the first drift zone section as far as a bottom of the trench and which does not reach beyond the trench in the lateral direction of the semiconductor body.

Another embodiment relates to a method for producing a trench transistor having a drift zone, the method including: providing a semiconductor body having a first side, producing a trench extending into the semiconductor body proceeding from the first side and having trench sidewalls, producing a field electrode in the trench, which field electrode is insulated from the semiconductor body by a field electrode dielectric and partly fills the trench, such that regions of the trench sidewalls are not covered by the field plate dielectric and the field plate dielectric is uncovered at the bottom of a trench produced after the production of the field electrode, producing a protective layer at regions of the trench sidewalls which are not covered by the field plate dielectric, introducing dopant atoms into uncovered regions of the field plate dielectric, and introducing dopant atoms from the field plate dielectric into the semiconductor body in order to produce a doped semiconductor zone forming a part of the drift zone.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1 illustrates a method for producing a drift zone section—arranged below a trench—of a trench transistor using spacers applied to sidewalls of the trench.

FIG. 3 illustrates a method which is modified relative to the method in accordance with FIG. 1 and in which two spacers are applied to the sidewalls of the trench one above another.

FIG. 4 illustrates, on the basis of a vertical cross section through a semiconductor body, a first exemplary embodiment of a trench transistor having a drift zone with two drift zone sections.

FIG. 5 illustrates a second exemplary embodiment of a trench transistor with two drift zone sections.

FIG. 6 illustrates a third exemplary embodiment of a trench transistor with two drift zone sections.

FIG. 8 illustrates a horizontal cross section through the semiconductor body of the trench transistors in accordance with FIGS. 4 to 7 (FIG. 8A) and a further vertical cross section through the semiconductor body in a different sectional plane (FIG. 8B).

FIG. 9 illustrates a further method for producing a drift zone section of a trench transistor.

FIG. 10 illustrates a method for producing a drift zone section of a trench transistor, in which an additional trench extending further into the semiconductor body is produced proceeding from a bottom of the trench.

FIG. 11 illustrates a first exemplary embodiment of a trench transistor with a drift zone section produced according to the method in accordance with FIG. 10.

FIG. 17 illustrates a further method for producing a trench transistor.

DETAILED DESCRIPTION

Figure 2A:
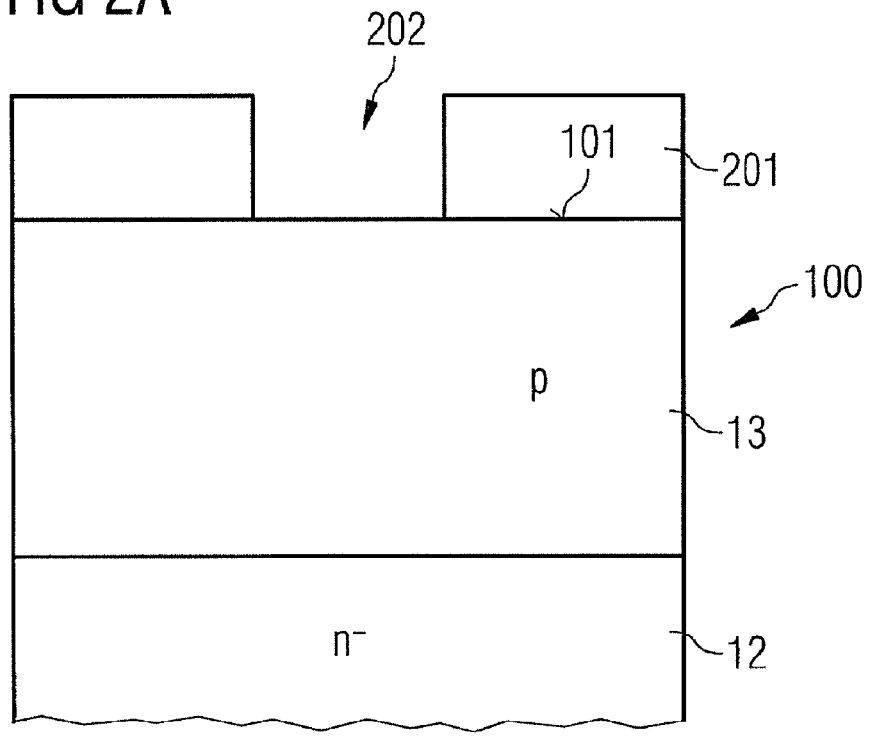
FIG. 2 illustrates a method for producing the spacers at the sidewalls of the trench.
Figure 2B:
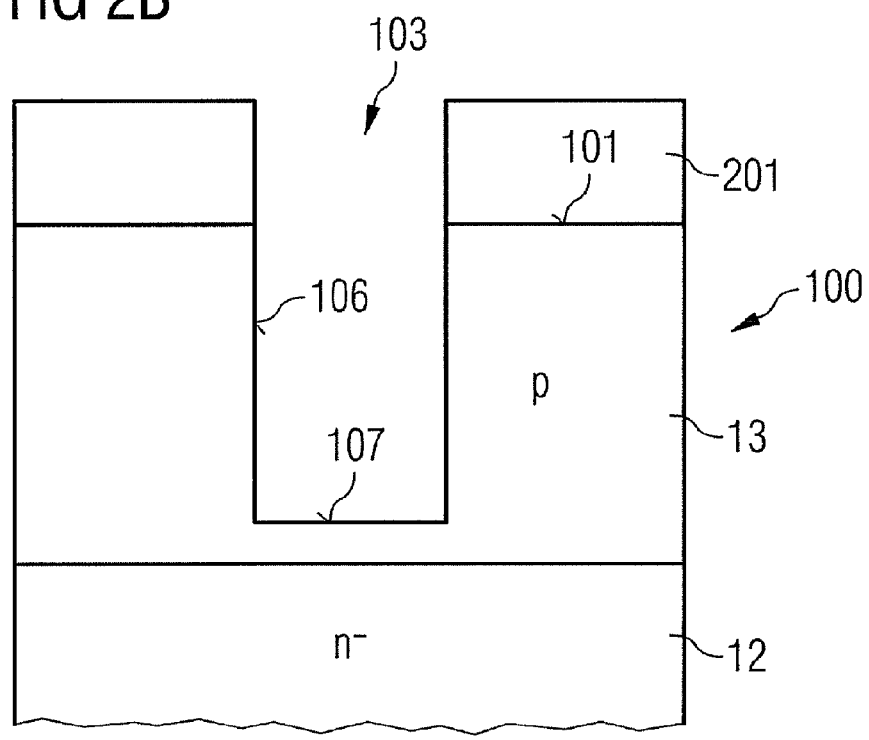

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise. FIG. 1 illustrates a method for producing a drift zone of a trench transistor having two drift zone sections. In order to elucidate this method, FIGS. 1A and 1B show illustrate a vertical cross section through a semiconductor body 100 during individual method processes.

The semiconductor body 100 has a first side 101, which is referred to hereinafter as front side, and a second side 102 opposite the first side 101, the second side being referred to hereinafter as rear side. The semiconductor body 100 additionally has a first semiconductor zone 12 of a first conduction type and a second semiconductor zone of a second conduction type complementary to the first conduction type, the second semiconductor zone being adjacent to the first semiconductor zone 12 in the vertical direction of the semiconductor body 100. The first semiconductor zone 12 is, for example, arranged in a doped epitaxial layer—or formed by such an epitaxial layer—applied to a more highly doped semiconductor substrate 11, as is illustrated in FIG. 1A. The second semiconductor zone 13 is, for example, a further doped epitaxial layer applied to the epitaxial layer with the first semiconductor zone 12, or is a doped semiconductor zone produced by redoping the epitaxial layer with the first semiconductor zone 12 in a region below the front side 101.

The first semiconductor zone 12 can also be, in a manner not specifically illustrated, a lightly doped semiconductor substrate to which the second semiconductor zone 13 is applied as epitaxial layer. In this case, the second semiconductor zone 13 can also be formed by redoping a part of the lightly doped semiconductor substrate.

In a manner yet to be explained, the first semiconductor zone 12 forms a part of the later drift zone of the trench transistor and is also referred to hereinafter as first drift zone section. At least one part of the second semiconductor zone 13 illustrated in FIG. 1A forms a body zone of the later trench transistor in a manner yet to be explained. A drain zone of the later trench transistor is formed by a semiconductor zone which is doped more highly than the drift zone 12 and which is adjacent to the first semiconductor zone 12 in the direction of the rear side 102. Referring to FIG. 1A this more highly doped semiconductor zone is a highly doped semiconductor substrate, for example. However, this more highly doped zone can also be—in a manner not specifically illustrated—a doped semiconductor zone produced by introducing dopant atoms into a region near the surface via the rear side 102 of the semiconductor body. In this case, the dopant atoms can be introduced by using an implantation method or a diffusion method.

In order to realize drain-up structures (not illustrated), in which the drain zone is realized as a buried highly doped semiconductor zone and is connected to a connection zone reaching as far as the front side, the drain zone can be produced by implanting dopants into regions near the surface of a substrate—usually doped complementarily with respect to the drain zone. After the implantation, an epitaxial layer is grown on the substrate, the epitaxial layer forming the first and second semiconductor zone 12, 13. It should be pointed out that the method processes explained below which relate to the production of component structures in the first and second semiconductor zone 12, 13 are independent of the production of a more highly doped semiconductor zone (11 in FIG. 1) adjacent to the first semiconductor zone 12.

The doping types indicated in FIG. 1A for the sake of better understanding, namely an n-type doping of the first semiconductor zone 12 and a p-type doping of the second semiconductor zone 13, relate to an n-conducting trench transistor. It goes without saying that the invention is not restricted to such an n-conducting transistor, but rather can also be applied to a p-conducting transistor in the same way. In the case of a p-conducting transistor, the dopings of the individual component zones should be chosen complementarily with respect to the doping types indicated in FIG. 1A and the subsequent figures.

The doping concentration of the first semiconductor zone 12 is, for example, between $1 \cdot 10^{13}$ cm$^{-3}$ and $5 \cdot 10^{17}$ cm$^{-3}$, in one embodiment between $1 \cdot 10^{15}$ cm$^{-3}$ and $1 \cdot 10^{17}$ cm$^{-3}$. The doping of the second semiconductor zone 12 can have in the vertical direction, for example, a Gaussian profile with a maximum doping concentration of between $5 \cdot 10^{16}$ cm$^{-3}$ and $1 \cdot 10^{19}$ cm$^{-3}$. In this case, the maximum doping concentration is present in the region of the front side 101. This region of maximum doping concentration can be redoped—in a manner yet to be explained—in order to produce a source zone of the component. In the region not redoped in this way, the doping concentration is, for example, at most $1 \cdot 10^{18}$ cm$^{-3}$. The first semiconductor zone 12 can be more lightly doped than the second semiconductor zone, but can also be more highly doped in the case of components having a low required dielectric strength.

"Trench transistor" should be understood hereinafter to mean both a trench MOSFET and a trench IGBT. In the case of a MOSFET the drain zone is of the same conduction type as the drift zone, whereas in the case of an IGBT, the drain zone, which is also referred to as emitter zone, is doped complementarily with respect to the drift zone. In both cases, before the drain zone/emitter zone, a field stop zone (not illustrated) of the same conduction type as the drift zone can be provided, which is doped more highly than the drift zone. In this case, the field stop zone can be directly adjacent to the drain zone, but can also be arranged at a distance from the drain zone. The doping types indicated in FIG. 1A relate to a MOSFET. In the case of an IGBT the more highly doped semiconductor zone 11 which is adjacent to the first semiconductor zone 12 and which forms the drain zone/emitter zone should be doped complementarily with respect to the first semiconductor zone 12 or the drift zone.

The method explained with reference to FIG. 1 provides for producing a second drift zone section of the same conduction type in addition to the first drift zone section, which is formed by the first semiconductor zone 12 arranged in buried fashion in the semi-conductor body 100. For this purpose, a trench 103 is produced, which extends into the semiconductor body 100 proceeding from the front side 101 and which has two mutually opposite trench sidewalls 106 and a trench bottom 107. In this case, the trench 103 is produced in such a way that the trench ends at a distance from the first drift zone section in the vertical direction, that is to say that the trench bottom 107 is arranged at a distance from the first drift zone section 12. Spacers 31 are applied to the mutually opposite trench sidewalls 106. These spacers 31 do not completely fill the trench, such that a clearance or narrower trench in which a section of the trench bottom 107 remains free is present between the spacers 31.

In a manner yet to be explained, the spacers 31 can form, for example, a part of a later gate electrode of the trench transistor. In this case, the spacers 31 include an electrically conductive material, for example, a highly doped polycrystalline semiconductor material, such as polysilicon, for example. If the spacers 31 are intended to be used as part of the later gate electrode of the trench transistor, before producing the spacers 31 a dielectric layer 21 is produced at least on those sections of the trench sidewalls 106 and of the trench bottom 107 on which the spacers 31 are produced. The dielectric layer 21 serves as a gate dielectric layer of the later trench transistor and includes, for example, a semiconductor oxide, for example, silicon oxide.

The dielectric layer 21 can be produced by thermal oxidation after the trench 103 has been produced. Such a thermal oxidation leads to a whole-area oxidation of the surface of the semiconductor body. The oxide layer thereby arising above the front side 101 can initially remain on the front side 101, which is illustrated by dashed lines in FIG. 1A or can be removed, for example, by using an etching method. The oxide layer can be removed in masked fashion in such a way that the dielectric layer 21 is removed only above the front side 101 of the semiconductor body and remains in that bottom section of the trench which is not covered by the spacers 31. The dielectric layer 21 can also be removed in unmasked fashion, such that the oxide layer 21 is removed from all uncovered regions, that is to say from the front side 101 and from that bottom section of the trench which is not covered by the spacers 31. During the subsequent method processes, that bottom section of the trench 103 which is not covered by the spacers 31 can be covered by the dielectric layer 21, but the semiconductor body 100 can also be uncovered in this region.

"Covered bottom section of the trench" should be understood herein after to mean a section of the trench bottom which is covered by the spacers 21. In this region, a dielectric layer 21 can be arranged between the spacers 21 and the semiconductor body 100. Correspondingly, "left-free bottom section of the trench" should be understood hereinafter to mean a section of the trench bottom 107 which is not overlapped by the spacers 21 but which can be covered by a dielectric layer 21 and/or which can be covered by a dispersing layer in a manner yet to be explained.

FIG. 1B illustrates the semiconductor body 100 during further method processes in which dopant atoms are introduced into that section of the second semiconductor zone 13 which is arranged between the trench bottom 107 and the first semiconductor zone 12 via that section of the trench bottom 107 which is left free by the spacers 31. Referring to FIG. 1B, the dopant atoms are introduced, for example, by using an implantation method with an implantation direction running at least approximately perpendicular to the front side 101 of the semiconductor body 100. By using the implantation, the dopant atoms, proceeding from the trench bottom 107, firstly penetrate into the semiconductor body or into the second semiconductor zone 13 of the semiconductor body 100 only in the perpendicular direction. Activation of the implanted dopant atoms requires, in a manner not specifically illustrated, a thermal process by using which at least the implantation region is heated to a predetermined activation temperature for a predetermined activation duration. On account of this activation, the implanted dopant atoms are incorporated into crystal lattice sites of the crystal lattice of the semiconductor material. The result of the doping process explained above is a third semiconductor zone 14 of the first conduction type, which is directly adjacent to the trench bottom 107 of the trench 103 and which reaches as far as or into the first semiconductor zone 12. The third semiconductor zone 14 forms a further section of the drift zone of the later trench transistor and is also referred to hereinafter as second drift zone section 14.

The second drift zone section 14 overlaps the spacers 31 in sections in the lateral direction of the semiconductor body 100. This overlapping in the lateral direction can be the result of a diffusion process which results from the thermal treatment on account of which the implanted dopant atoms indiffuse further into the semiconductor body 100, to be precise in both the horizontal and the vertical direction. The overlapping can also be the result of a lateral dispersion of the dopant atoms during the implantation. Such a dispersion can be intensified by a dispersing layer applied to the left-free bottom section of the trench 103. Such a dispersing layer can be the dielectric layer 21. As an alternative or in addition to the dielectric layer 21 as dispersing layer, before the implantation a further dispersing layer 61 (illustrated by dashed lines) could be applied to the left-free section of the trench bottom. If a sufficient overlapping in the lateral direction is already achieved by a dispersion of the implanted dopant atoms, the thermal process after implantation can be so short that only an activation of the implanted dopant atoms but no significant diffusion takes place. Otherwise, the duration of the thermal process should be chosen to be longer, such that an appreciable diffusion of the dopant atoms is effected. The overlapping between the spacers 21 and the second drift zone section 14 influences the gate-drain capacitance of the later trench transistor, in a manner yet to be explained, if the spacers 21 are part of the later gate electrode. A small overlap between the second drift zone section 14 and the gate electrode is necessary in order to enable the control of a conducting channel in the later component, or in order to keep the on resistance of the component low.

During the introduction of the dopant atoms over the left-free section of the trench bottom 107, the front side 101 of the semiconductor body can be masked in order to prevent dopant atoms from being introduced in a region below the front side 101. For this purpose, by way of example, a mask used for producing the trench 103, which mask will also be explained with reference to FIG. 2, can remain on the front side 101 of the semiconductor body 100 during the introduction of the dopant atoms. However, the implantation of dopant atoms can also be effected in unmasked fashion, such that dopant atoms are introduced into the semiconductor body both via the trench bottom 107 and via the front side 101. The doped regions arising below the front side 101 as a result of this are illustrated by dashed lines in FIG. 1B and designated by the reference symbol 15. The doping of this semiconductor zone 15 can later form a part of the source doping of the source zones that are yet to be produced.

As an alternative to an implantation method, the dopant atoms can also be introduced by using a diffusion method. For this purpose, a layer (not illustrated) containing dopant atoms, for example, a doped glass layer or a doped polysilicon layer, is applied to the left-free bottom section of the trench. The doped layer can be applied to a dielectric layer 21 applied to the trench bottom, but is applied in one embodiment directly to the semiconductor body in this section of the trench bottom in order to achieve a well-reproducible doping. The dopant atoms contained in the doped layer are subsequently indiffused into the semi-conductor body by using a thermal process.

It was assumed for the explanation above that a second semiconductor zone 13 doped complementarily with respect to the first semiconductor zone 12 is already present when producing the second drift zone section 14, the second semiconductor zone extending in the vertical direction of the semiconductor body 100 proceeding from the front side 101 as far as below the trench. It is also possible to produce the second semiconductor zone 13 completely or partly together with the second drift zone section 14. If the duration of the thermal process for producing the second drift zone section 14 is chosen such that the dopant atoms introduced via the trench 103 indiffuse into the semiconductor body, then the dopant atoms of the second semiconductor zone 13 also diffuse in the vertical direction of the semi-conductor body 100, whereby the second semiconductor zone 13 expands in the direction of the first semiconductor zone 12. A section of the second semiconductor zone 13 which is present between the trench bottom and the first semiconductor zone 12 can therefore arise completely or partly during a diffusion process for producing the second drift zone section. In this case, the second semiconductor zone 13 can end above the trench bottom before the production of the second drift zone section 14, which is tantamount to the fact that the trench reaches right into the first semiconductor zone 12 before the production of the second drift zone section 14.

If, for producing the second drift zone section, a dopant is used which diffuses more slowly during a thermal process than a dopant used for producing the second semiconductor zone 13, the second drift zone section and the second semiconductor zone 13 can be produced simultaneously. In this case, dopants for producing the second semiconductor zone 13 are implanted into a region near the surface of the front side 101, or a layer containing dopant atoms is applied to the front side 101 of the semiconductor body 100. In addition, dopant atoms for producing the second drift zone section 14 are implanted into the semiconductor body 100 via the left-free bottom section of the trench 103, or a layer containing dopant atoms is applied to the section of the trench bottom. A suitable dopant for producing the second semiconductor zone 13 is boron (B), for example, and a suitable slowly diffusing dopant for producing the second drift zone section 14 is arsenic (As), for example. During a subsequent thermal process, the dopant atoms indiffuse into the semiconductor body proceeding from the front side 101 and proceeding from the trench bottom 107, whereby the second semiconductor zone 13 and the second drift zone section 14 arise. Owing to the higher diffusion rate of the dopant atoms of the second semiconductor zone 13, the second semiconductor zone 13 advances in the course of the diffusion process the second drift zone section 14 further in the vertical direction than the second drift zone section, that is to say that a vertical extent of the second semiconductor zone 13 is smaller than that of the second drift zone section 14, which ultimately leads to the structure illustrated in FIG. 1B, in which the first drift zone section 14 extends through the second semiconductor zone 13 as far as or right into the first semiconductor zone 12. The dopant concentrations or the implantation doses are chosen for producing these two semiconductor zones 13, 14 such that the dopants of the second semiconductor zone 13 which diffuse into the semiconductor body do not redope the second drift zone section 14.

A possible method for producing the trench 103 and the spacers 31 arranged at the trench sidewalls 106 is explained below with reference to FIGS. 2A to 2E. The figures each illustrate vertical cross sections through the semiconductor body 100 during different method processes of this method.

Referring to FIG. 2A, this method firstly involves producing a patterned mask 201 above the front side 101 of the semiconductor body. The mask includes, for example, an oxide or photoresist and has a cutout 202 above that region of the semiconductor body 100 in which the trench is to be produced.

Using the mask 201, the trench 103 is subsequently etched into the semiconductor body 100 proceeding from the front side 101, for example, by using an anisotropic etching method. In this case, the parameters of the etching method, in one embodiment the duration thereof, are chosen such that a trench 103 arises which ends in the vertical direction still above the first semiconductor zone 12, that is to say the trench bottom 107 of which is arranged at a distance from the first semiconductor zone 12. This is illustrated as the result in FIG. 2B.

Figure 2C:
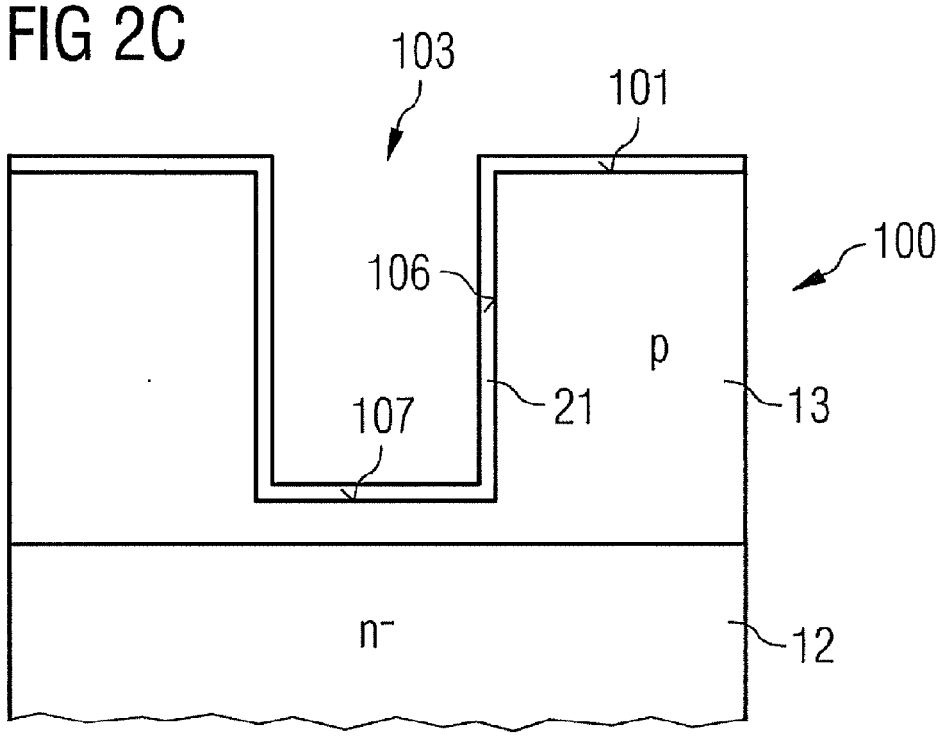

Optionally—namely when the spacer is intended to be part of the later gate electrode—referring to FIG. 2C, the dielectric layer 21 is subsequently produced, which dielectric layer forms the later gate dielectric layer. For this purpose, the semiconductor body 100 is subjected to an oxidation process, for example, on account of which an oxide layer is formed at the trench sidewalls 106 and the trench bottom 107.

Figure 2D:
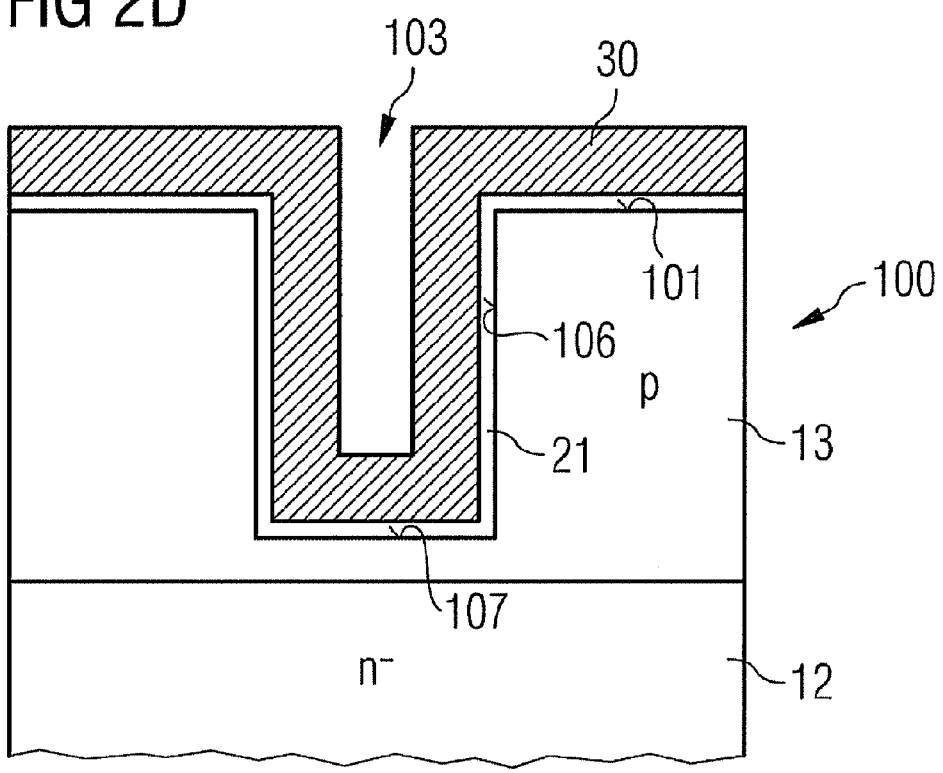

Referring to FIG. 2D, a spacer layer 30 is subsequently applied directly to the semiconductor body or to the dielectric layer 21 optionally present, which spacer layer initially covers the trench sidewalls 106 and the trench bottom 107 within the trench and the front side 101 of the semiconductor body 100 outside the trench. The spacer layer 30 is produced, for example, by conformal deposition of a material suitable for producing the spacers. If the spacers—as already explained—are intended to form the later gate electrode, the spacer layer 30 includes an electrically conductive material, for example, highly doped polysilicon.

Figure 2E:
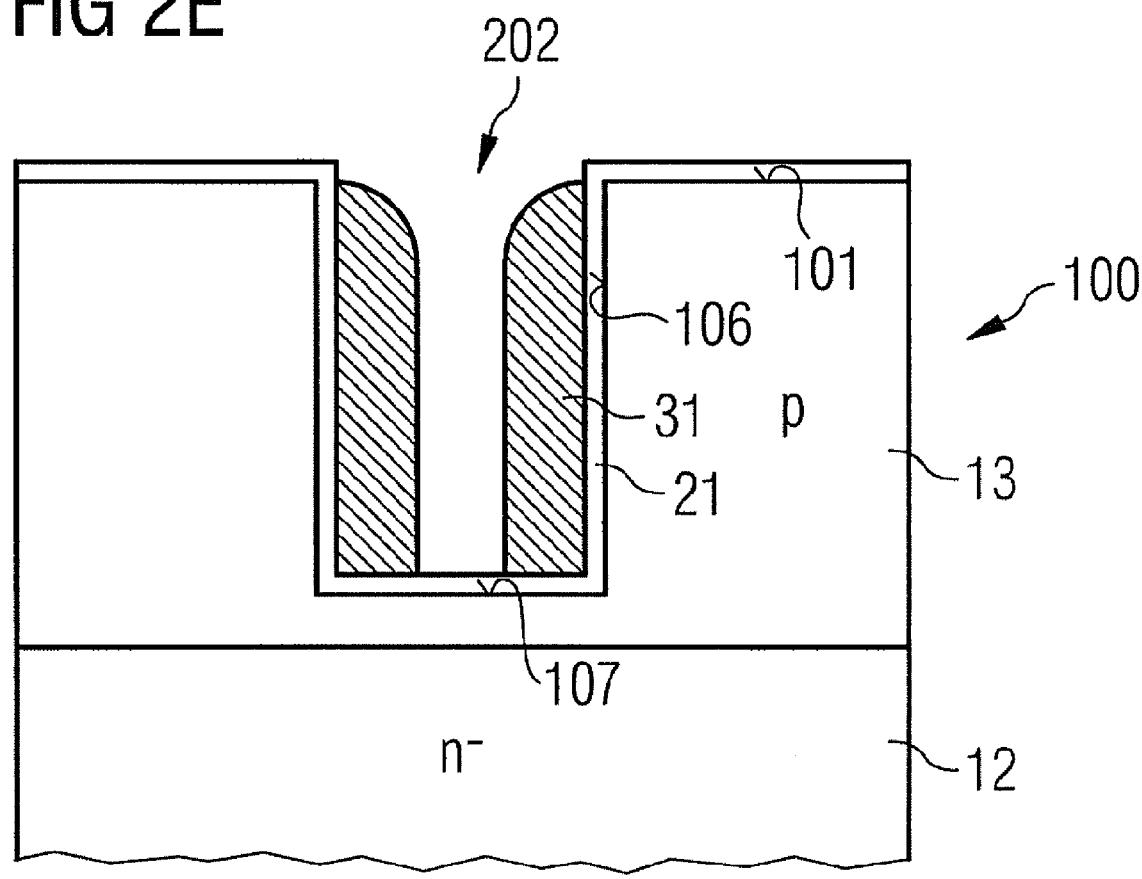

In order to produce the spacers 31, referring to FIG. 2E, the spacer layer 30 is removed at least from the section of the trench bottom via which the dopant atoms are introduced into the second semiconductor zone 13 (cf. FIG. 1B). For this purpose, the spacer layer 30 is etched back anisotropically, for example. By using such an anisotropic etching process, the spacer layer 30 is removed uniformly in only one direction, in the vertical direction in the example, such that the spacer layer is removed above the front side 101 and in sections above the trench bottom 107, but remains at the trench sidewalls 106 and forms the spacers 31 there. Proceeding from the trench sidewalls 106, the spacers 31 also extend over sections of the trench bottom 107, but a section of the trench bottom 107 which is covered at most by the dielectric layer 21 remains free between the spacers 31.

As already explained, the overlap between the third semiconductor zone 14 and the spacers 31 determines the gate-drain capacitance of the later trench transistor if the spacers 31 are a part of the later gate electrode of the component. In order to reduce the overlap, referring to FIG. 3, further spacers 51 can be produced on the spacers 31 already present at the trench sidewalls 106. A clearance or a narrower trench which leaves free a section of the trench bottom 107 remains between the further spacers 51. Via this left-free section of the trench bottom, according to the method explained with reference to FIG. 1B, dopant atoms are introduced into that section of the second semiconductor zone 13 which is arranged between the trench bottom 107 and the first semiconductor zone 12.

The second spacers 51 are produced, for example, according to the method explained with reference to FIG. 2 for the production of the first spacers 31, that is to say by depositing a spacer layer and by anisotropically etching back the spacer layer. As an alternative to depositing a spacer layer, the second spacers 51 can also be produced by oxidation of the first spacers. The layer deposited for producing the second spacers 51 is, for example, thinner than the spacer layer (30 in FIG. 2D) deposited for producing the first spacers 31.

As already explained, dopant atoms for producing the second drift zone section 14 can be implanted into the semiconductor body through a dispersing layer on the left-free bottom section of the trench in order thereby to intensify a dispersion in the lateral direction. In one embodiment the first and/or second spacer layers are suitable as dispersing layer. The method process for anisotropic etching back, the result of which is illustrated in FIG. 2E, is dispensed with in this case, that is to say that the implantation of dopant atoms as explained with reference to FIG. 1B is effected directly after depositing the spacer layer 30 and/or after depositing the optional layer for producing the second spacers. The spacers which prevent an implantation into the trench bottom are formed in the latter by the sections of the mask layer which are applied to the sidewalls 106 of the trench and the dimensions of which in the lateral direction correspond to the thickness of the spacer layer. Apart from dispersion effects, therefore, no dopants are implanted into those regions of the semiconductor body which extend below the trench bottom proceeding from the sidewalls in the direction of the trench center and the dimensions of which in the direction correspond to the thickness of the mask layer.

FIG. 4 illustrates, on the basis of a cross section through a semiconductor body 100, a first exemplary embodiment of a trench transistor produced, proceeding from the component structures in accordance with FIG. 1B or 3, after carrying out further production processes. The optionally present second spacers 51 are illustrated by dashed lines in FIG. 4. The trench transistor includes a drift zone formed by the first and second drift zone section 12, 14 and a body zone formed by the second semiconductor zone 13, the body zone being adjacent to the drift zone 12, 14 and being doped complementarily with respect to the drift zone. In the direction of the front side 101, a source zone 16 doped complementarily with respect to the body zone 13 is adjacent to the body zone 13, the source zone adjoining the trench in the lateral direction of the semiconductor body 100. The source zone 16 is produced, for example, by a masked implantation of dopant atoms via the front side 101 of the semiconductor body.

The trench transistor additionally has a gate electrode arranged in the trench, which gate electrode, in the example illustrated, is formed exclusively by the spacers 31 applied to the sidewalls of the trench. In the case of the transistor illustrated in FIG. 4, the clearance within the trench that remained after producing the first spacers or the first and the second spacers 31, 51 is filled by an insulation material 22, which is introduced into the trench after the drift zone section 14 has been produced. For this purpose, an insulation layer is deposited over the whole area, for example, above the front side 101 of the semiconductor body, which insulation layer completely fills the trench. The insulation layer is subsequently removed again above the front side 101 of the semiconductor body—at least from those regions of the semiconductor body 100 in which contact is to be made with active component regions such as the source zone—in a manner not specifically illustrated.

The trench transistor illustrated additionally has a source electrode 41 arranged above the front side 101 of the semiconductor body, which source electrode makes electrically conductive contact with the source zone 16. In a manner known in principle, the source electrode 41 can also make electrically conductive contact with the body zone 13, and thereby short-circuit the body zone and the source zone 16. In order to reduce a contact resistance, a connection zone 17 can be provided in this case, which connection zone is of the same conduction type as the body zone 13 but is more highly doped and is arranged between the source electrode 41 and the body zone 13. The connection zone 17 can be produced before the production of the source electrode 41, for example, by using a masked implantation of dopant atoms of the second conduction type via the front side 101 into the semiconductor body.

A more highly doped semiconductor zone 11 adjacent to the second drift zone section 12 in the direction of the rear side 102 forms a drain zone of the trench transistor. The drain zone 11 can be—as already explained—a semiconductor substrate, for example, to which the first drift zone section 12 is applied in the form of an epitaxial layer. Instead of realizing the first drift zone section 12 as an epitaxial layer there is also the possibility—in a manner not specifically illustrated—of providing a lightly doped semiconductor substrate having a basic doping which to the doping of the later first drift zone section 12. In this case, the drain zone can be produced by implanting dopant atoms into a region near the surface of the semiconductor substrate.

A drain electrode 42 makes contact with the drain zone 11—independently of the production thereof—the drain electrode being applied to the rear side 102 of the semiconductor body. The drain electrode 42 forms a drain connection D, the source electrode 41 forms a source connection S and the gate electrode 31 forms a gate connection G of the trench transistor.

The component illustrated in FIG. 4, which is realized as an n-conducting trench transistor, conducts upon application of a positive voltage between the drain connection D and the source connection S and upon application of a suitable drive potential to the gate electrode 31, resulting in the formation, along the gate dielectric 21, of an inversion channel in the body zone 13 between the source zone 16 and the second drift zone section 14. The overlap between the second drift zone section 14 and the gate electrode 31 defines a gate-drain capacitance of the transistor which is very small due to the production method explained previously. Due to the production method explained previously the dimensions of the second drift zone section 14 in the lateral direction are smaller than the width of the trench 103 in the direction.

FIG. 5 illustrates a trench transistor that is modified relative to the trench transistor in accordance with FIG. 4. A gate electrode of this trench transistor has the spacers 31 as first gate electrode section and a second gate electrode section 32. The second gate electrode section 32 is produced, for example, by completely filling the trench with an electrode material after producing the spacers 31 and after introducing the dopant atoms for producing the second drift zone section 14. If, for producing the second drift zone section 14, second spacers (51 in FIG. 3) are applied to the first spacers 31, which are electrically insulating, then the spacers are at least partly removed before the second gate electrode section 32 is produced. The second spacers 51 can also remain on the first spacers 31 in a manner not specifically illustrated. In this case, the electrode material serves merely as filling material for filling the remaining trench without an electrical function.

The component in accordance with FIG. 5 has a low gate resistance but, in comparison with the component in accordance with FIG. 4, a higher gate-drain capacitance. Referring to FIG. 6, the the gate-drain capacitance can be reduced by producing a further insulation layer or dielectric layer 24 above the trench bottom before the second gate electrode section 32 is produced. For this purpose, the trench remaining after the first spacers 31 have been produced is, for example, firstly filled partly with an insulation material—or firstly filled completely and subsequently etched free again in the upper region. A remaining trench that has remained—or has been produced again by etching free in the upper region—is subsequently filled completely with an electrode material that forms the second gate electrode section 32. Due to the insulation material 24, the second gate electrode section 32 is arranged at a distance from the gate dielectric 21 and the second drift zone section 14, such that the second gate electrode section 32 does not contribute—or contributes insignificantly at most—to the gate-drain capacitance of the component.

Figure 7:
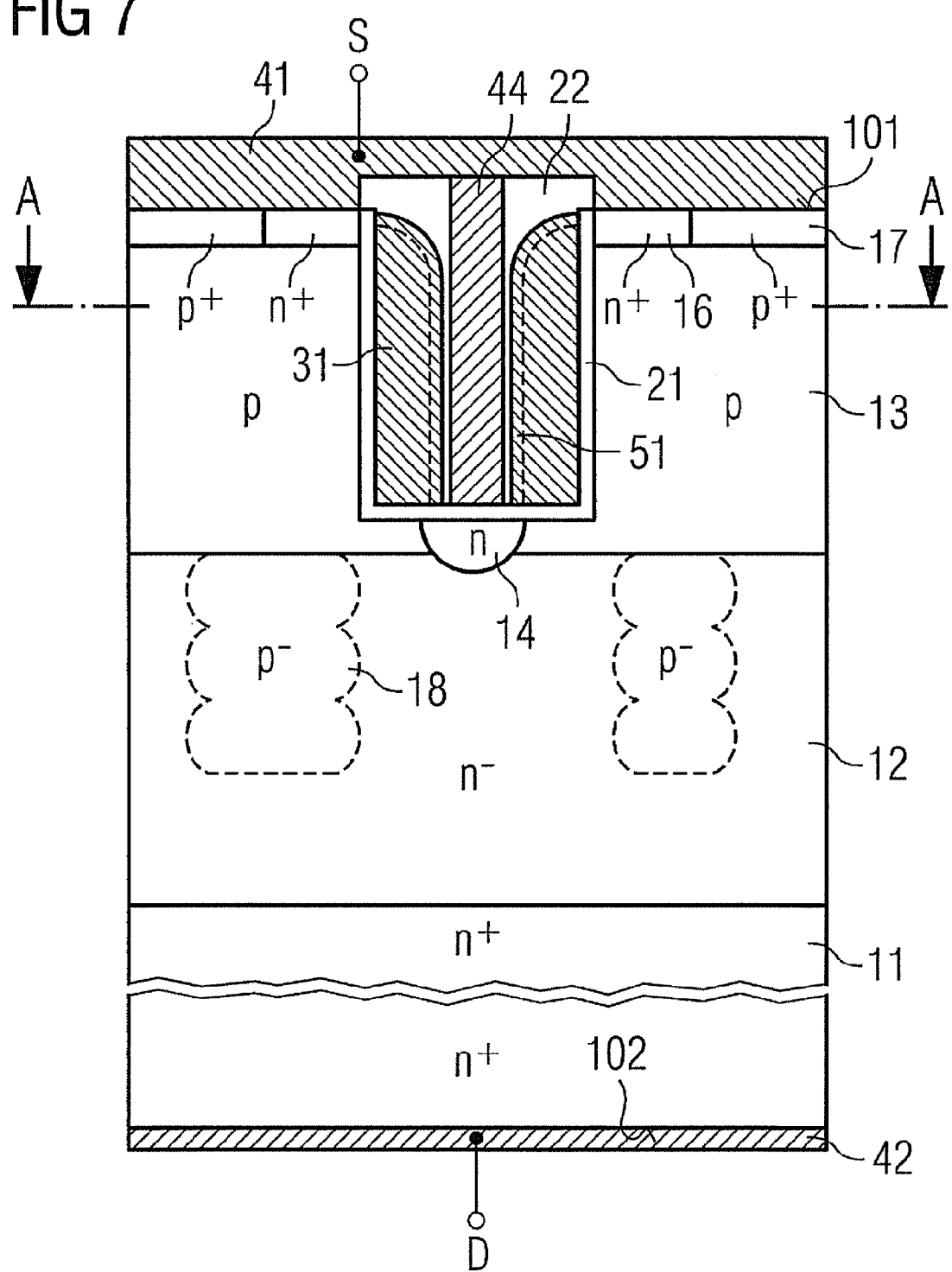
FIG. 7 illustrates a fourth exemplary embodiment of a trench transistor with two drift zone sections.

FIG. 7 illustrates a further exemplary embodiment of the trench transistor. In the case of this transistor, a gate electrode is formed exclusively by the spacers 31. Between the gate electrode sections formed by the spacers 31, in the case of this component a source electrode section 44 extends as far as the trench bottom. The source electrode section 44 is insulated from the gate electrode 31 by a dielectric layer 22. The insulating dielectric layer 22 can either be the second spacer layer 51 and/or can be a further insulation layer applied to the first spacers 31 or the second spacers 51. If the insulation between the source electrode section 44 and the gate electrode is achieved by using the second spacers 51, the second spacers 51 should be chosen such that they include an electrically insulating material. The source electrode section 44 extending into the trench leads to a further reduction of the gate-drain capacitance. In the case of the component in accordance with FIG. 4, the gate-drain capacitance results from the direct overlapping between the second drift zone section 14 and the spacers, and thus from the capacitive coupling of the spacers to the second drift zone section 14 via the gate dielectric 21, and from the capacitive coupling of the spacers 21 via the dielectric layer 22 filling the trench to the second drift zone section 14. This—not inconsiderable—second component of the gate-drain capacitance is not present in the case of the component in accordance with FIG. 7.

The trench transistors explained above can be realized as compensation components. In this case, compensation zones 18 are arranged in the first drift zone section 12, which compensation zones can be adjacent to the body zone 13 and are doped complementarily with respect to the drift zone 12, 14. In the case where the component is driven in the blocking state, the compensation zones 18 bring about a compensation of the dopant charge present in the drift zone 12, 14 and thus enable a higher dielectric strength of the component for a given doping of the drift zone 12, 14 or a higher doping of the drift zone 12, 14 and hence a lower on resistance for a given dielectric strength. In a manner not specifically illustrated, the compensation zones 18 can also be arranged in floating fashion, i.e. not connected to the body zone 13, and also be arranged alongside one another and one above another.

The trench transistor can be constructed in cellular fashion by virtue of a multiplicity of identically constructed transistor cells connected in parallel being present. In this case, each of the transistor cells includes one of the transistor structures explained with reference to FIGS. 4 to 7 including a source zone, a body zone and a gate electrode arranged in the trench. In this case, a plurality of source zones of the individual transistor cells are electrically conductively connected to one another in each case, and a plurality of gate electrodes of the individual transistor cells are electrically conductively connected to one another in each case. A drift zone and a drain zone are common to a plurality of transistor cells.

The individual transistor cells can be realized, for example, as strip cells. In this case, the gate electrodes run in a direction perpendicular to the plane of the drawing illustrated in FIGS. 4 to 7, as elongated strips. FIG. 8A illustrates a horizontal cross section through the semiconductor body 100 in a sectional plane A-A illustrated in FIGS. 4 to 7, in order to illustrate such a strip geometry. In the case of this component, the trench with the gate electrode 31 or 31 and 32 is formed such that it is elongated in a horizontal direction of the semiconductor body. A further trench can run transversely with respect to the trench, in which further trench is arranged a connection electrode 33 which is electrically conductively connected to the gate electrode 31 or 31 and 32 and which, in the case of a cellular transistor structure, electrically conductively connects the gate electrodes arranged in the individual trenches to one another. The connection electrode 33 arranged in the further trench is insulated from the semiconductor body by a further dielectric layer 23. The further trench can be formed such that it is narrower than twice the layer thickness of the spacer layer (30 in FIG. 2D). The trench is then filled completely during the deposition of the spacer layer, such that—unlike in the rest of the trenches—no spacers are formed, and such that the connection electrode 33 arises.

Referring to FIG. 8B, which illustrates a cross section through the semiconductor body in a sectional plane B-B illustrated in FIG. 8A in the region of the connection electrode 33, the connection electrode 33 can reach as far as the level of the front side 101 of the semiconductor body and contact can be made with it there by a further connection electrode 43, which forms a gate connection G of the transistor. The gate electrodes are thereby led as far as the front side of the semiconductor body in the region of the connection electrode 33 and contact can correspondingly be made with them there.

As an alternative, the spacer etching for producing the spacers can be implemented in masked fashion in the region in which contact is to be made with the gate electrode, such that gate electrode material, proceeding from the trench, reaches as far as the surface where contact can be made with it.

FIG. 9 illustrates a modification of the method for producing the second drift zone section 14 as explained with reference to FIGS. 1 and 3. In this method, a plurality of implantation processes with different implantation energies are carried out in order to introduce dopant atoms into different depths proceeding from the trench bottom 107. This method finds application, for example, when the distance between the trench bottom 107 and the first drift zone section 12 is too large to produce the second drift zone section with just one implantation, or in the case of which, in conjunction with just one implantation, a considerable indiffusion would be required, which would result in a correspondingly large overlap between the second drift zone section and the gate electrode. This method gives rise, underneath that section of the trench bottom 107 which is not covered by spacers 31, to a plurality (at least two) of doped sections of the first conduction type which are arranged in different depths in the first semiconductor zone 13 proceeding from the trench bottom in the vertical direction. The implantation energies and temperature and duration of the annealing process are coordinated with one another in such a way that the individual doped sections overlap in such a way that a continuously doped semiconductor zone of the first conduction type arises between the trench bottom and the first semiconductor zone 12, which semiconductor zone forms the second drift zone section 14.

According to the method in accordance with FIG. 3, in the case of the method in accordance with FIG. 9, second spacers 51 (illustrated by dashed lines), which include an electrically insulating material, for example, can be applied to the first spacers 31.

The production of the drift zone section 14 including a plurality of overlapping partial sections can be followed by the further method processes explained with reference to FIGS. 4 to 7 for completing the trench transistor. This results in trench transistors that differ from the trench transistors illustrated in FIGS. 4 to 7 merely by virtue of the fact that the second drift zone section 14 includes a plurality of mutually overlapping doped zones and which are not illustrated in detail.

A further modification of the methods explained with reference to FIGS. 1 and 3 is explained below with reference to FIGS. 10A and 10B. Referring to FIG. 10A, this method firstly involves producing a first section 14' of the second drift zone section by introducing dopant atoms via a section of the trench bottom which is not covered by the spacers 31 into that section of the second semiconductor zone 13 which is arranged between the trench bottom 107 and the second drift zone section 12. The dopant atoms are introduced, for example, by using an implantation or diffusion method. The method for producing the first section 14' of the second drift zone section corresponds to the method for producing the first drift zone section as explained with reference to FIGS. 1 and 3, with the difference that in the case of the method in accordance with FIG. 10, the distance between the trench bottom 107 and the first drift zone section 12 is so large that the initially produced first section 14' of the second drift zone section does not reach as far as the first drift zone section 12.

Proceeding from the trench bottom, a further trench 108 is subsequently produced. The trench is produced, for example, by using an etching method using the first spacers 31 or the optionally present second spacers 51 as a mask. In order to protect the front side 101 of the semiconductor body during this etching method, a protective layer (not illustrated) can be applied to the front side 101. The protective layer can be the mask (201 in FIG. 2) used previously for etching the first trench 103. The production of the further trench 108, the dimensioning of which in the lateral direction corresponds to the mutual distance between the first or second spacers 31, 51 within the trench, is effected, for example, in such a way that the the trench ends above the first drift zone section 12. However, the further trench 108 can also be produced in such a way that it reaches right into the first drift zone section 12.

Via the further trench 108, further dopant atoms of the first conduction type are subsequently introduced into regions of the second semiconductor zone 13 which surrounds the further trench 108. The dopant atoms can be introduced by using an implantation method or can be introduced by introducing a dopant layer into the trench in conjunction with a subsequent diffusion process. This results in a second section 14" of the second drift zone section, which is adjacent to the first section 14' or which overlaps the first section and which is adjacent to the first drift zone section 12 or reaches into the latter. The result is a second drift zone section 14 which includes second sections 14', 14" of the first conduction type and which extends continuously from the first drift zone section 12 as far as the trench bottom 107 of the first trench.

The production of the first section 14' of the second drift zone section 14 is optional in this method. In other words, the further trench 108 can be produced directly after producing the spacers 21 and before actually carrying out a first implantation or diffusion step. In this case, the second drift zone section 14 is formed exclusively by the second section 14".

The method explained with reference to FIG. 10 can be extended, given large distances between the trench bottom 107 and the first drift zone section, to the effect that the further trench is etched in sections in the direction of the first drift zone section, and that dopant atoms of the first conduction type are introduced into the first semiconductor zone 13 after the production of each trench section.

FIG. 11 illustrates the component structure in accordance with FIG. 10B after carrying out further method processes in which the further trench 108 and the vacant space between the first spacers 31 or the second spacers 51 is filled with an insulation material 26, and in which, in a manner already explained, a source zone 16 and also a source electrode 41 are produced in order to complete the trench transistor.

Figure 12:
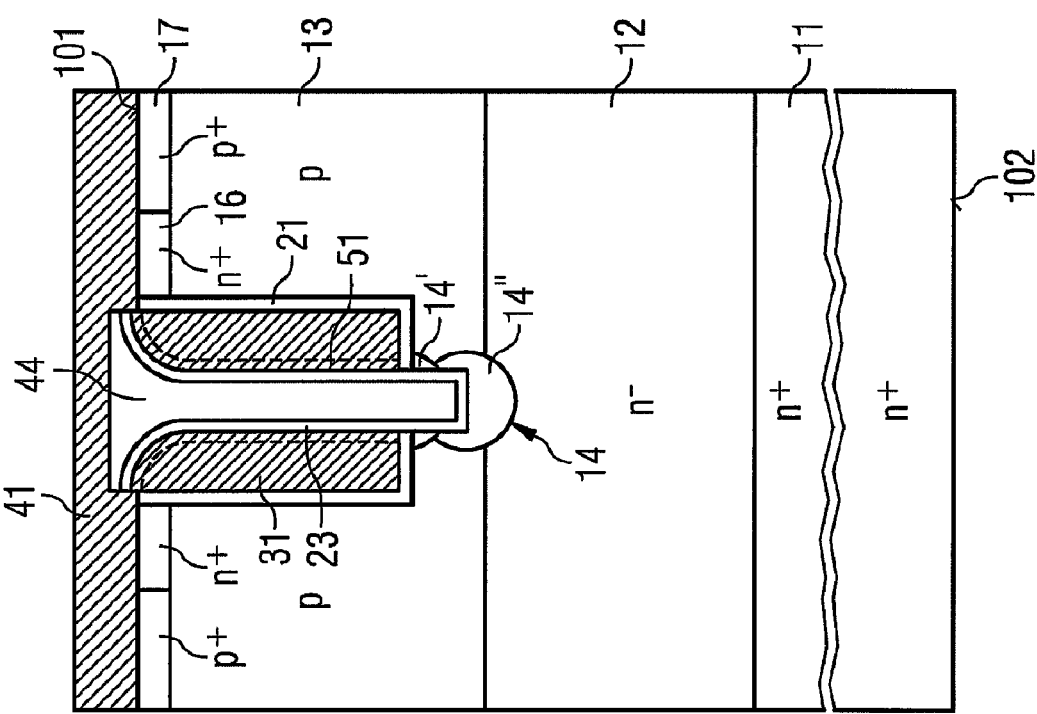
FIG. 12 illustrates a second exemplary embodiment of a trench transistor with a drift zone section produced according to the method in accordance with FIG. 10.

Instead of filling the trench with an insulation material, there is also the possibility of producing an electrode 44 in the trench, which electrode is connected to the source electrode 41 and is insulated from the gate electrode 31 and the second drift zone section 14 by a dielectric layer. A component having such an electrode 44 connected to the source electrode 41 and having an insulation layer surrounding the electrode 44 is illustrated in FIG. 12.

Figure 13A:
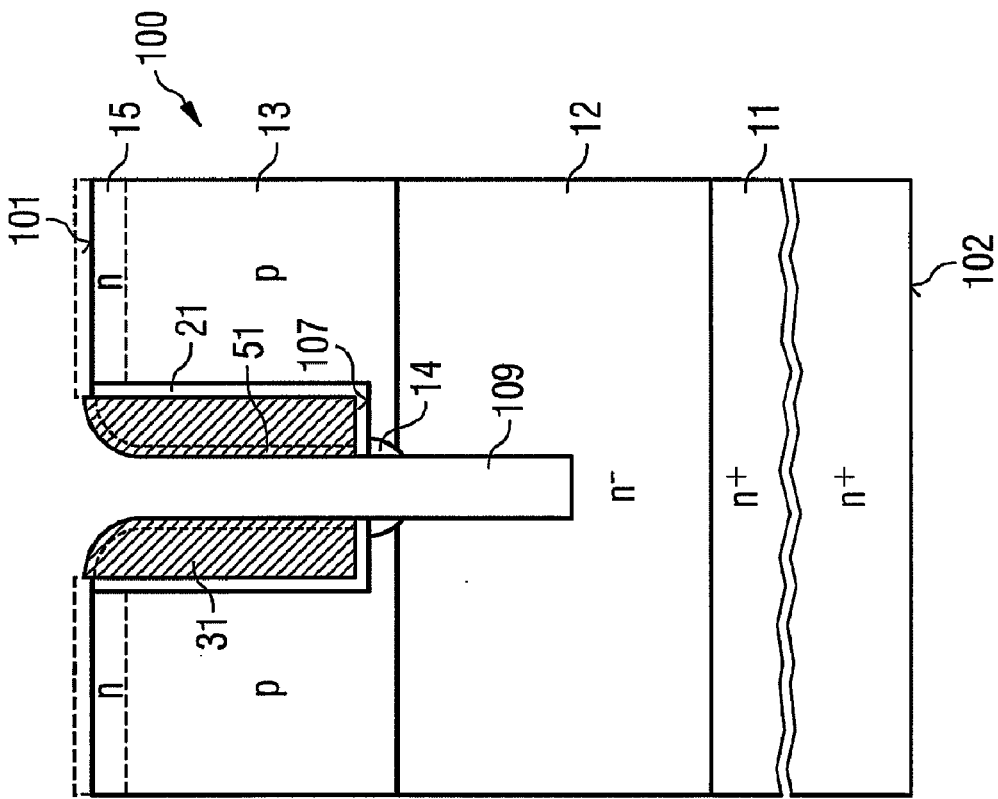
FIG. 13 illustrates a method for producing a trench transistor in which a field electrode dielectrically insulated from the drift zone is produced.

FIGS. 13A to 13C illustrate a further modification of the methods explained with reference to FIGS. 1 and 3. This method involves producing a further trench 109 after producing the second drift zone section 14 proceeding from the trench bottom 107 of the first trench, the further trench reaching right into the first drift zone section 12. The trench 109 can be produced, for example, by using an etching method using the first and/or second spacers 31, 51 as an etching mask. FIG. 13A illustrates a cross section through the semi-conductor body 100 after the trench 109 has been produced. In this case, along sidewalls of the trench 109, sections of the semiconductor zone of the first conduction type, which was produced in accordance with the methods explained with reference to FIGS. 1 and 3, remain in the second semiconductor layer 13. These sections remaining at the sidewalls of the further trench 109 form the second drift zone section 14 of this component.

Referring to FIG. 13B, sidewalls and a bottom of the further trench 109 are subsequently covered with a dielectric layer 26. Depending on the method for producing the the dielectric layer, in this case the first or second spacers 31, 51 in the first trench can also be covered with the dielectric layer 26. The the dielectric layer 26, which is an oxide layer, for example, is deposited over the whole area, for example, and then initially also covers the front side 101 of the semiconductor body 100, as is illustrated as the result in FIG. 13B. The thickness of the dielectric layer 26 is chosen such that it does not completely fill the trench 109 and the clearance between the first or second spacers, such that a trench 110 remains which, proceeding from the front side 101 of the semiconductor body, reaches right into the first drift zone section 12.

Instead of depositing the dielectric layer 26, the latter can also be produced by using a local oxidation of the semiconductor body in the region of the trench 109. In order in this case to prevent an oxidation of the spacers 31 that form the later gate electrode, a protective layer can be applied to the spacers. The function of such a protective layer can be fulfilled by the second spacers 51, which in this case include a nitride, for example. The field electrode subsequently produced is then insulated, in the region of the further trench, from the semiconductor body by the oxide layer and from the later gate electrode by the second spacers. For components in low voltage classes in which a thin insulation layer 24 between the field electrode 45 and the gate electrode 21 suffices, the entire dielectric layer 26 can be produced by an oxidation—of the semiconductor body in the trench 108 and of the spacers 21.

Referring to FIG. 13C, the trench is subsequently filled with an electrode material in order to produce a field electrode 45. The electrode material is, for example, a metal or a doped polycrystalline semiconductor material, such as polysilicon, for example.

Figure 13D:
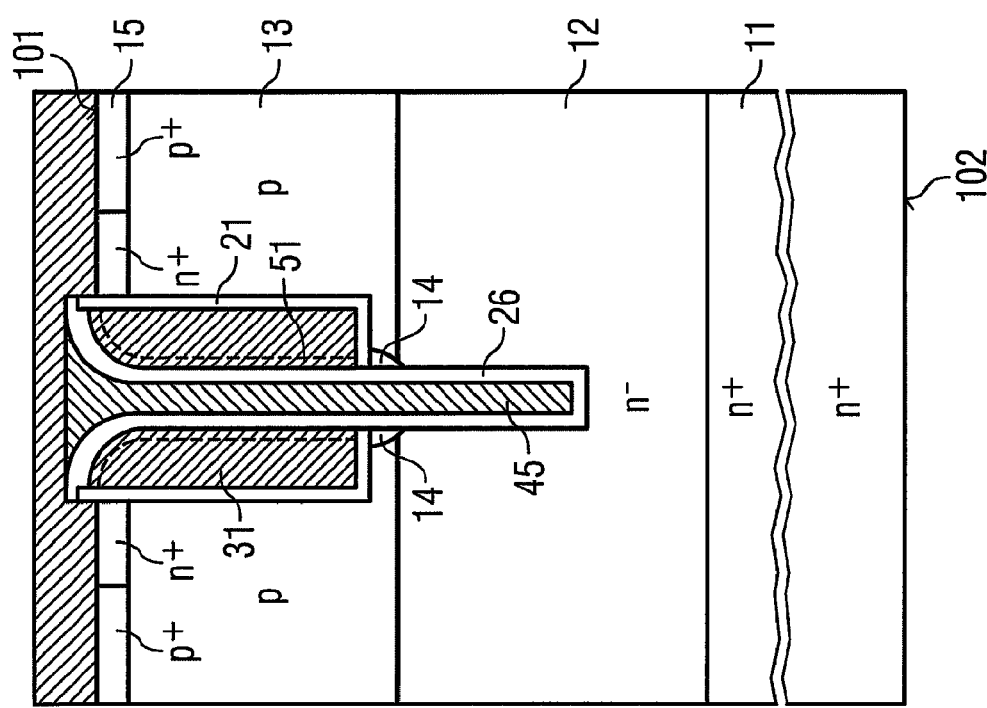

FIG. 13D illustrates a cross section through the semiconductor body after carrying out method processes for producing the source zone 16 and the connection zone 17 and also a source electrode 41, which makes contact with the field electrode 45. If the previous method processes are carried out in such a way that, after the field electrode 45 has been produced, parts of the dielectric layer 24 and/or of the gate dielectric layer 21 are still present above the front side 101 of the semiconductor body, then these dielectric layers are removed before producing the source electrode above the front side in such a way that it is possible to make contact with the source zone 16 and the connection zone 17, but that a dielectric insulation between the source electrode and the gate electrode 31 is still ensured.

The production of the field electrode 14 explained with reference to FIG. 13 is also possible in the case of the method explained with reference to FIG. 11 in that, after producing the second section 14" of the second drift zone section 14, the trench is lengthened right into the first drift zone section 12, and in that a field electrode 45 insulated from the semiconductor body and the gate electrode is produced in the trench thus produced. A trench transistor produced by such a method is illustrated in cross section in FIG. 14.

Figure 14:
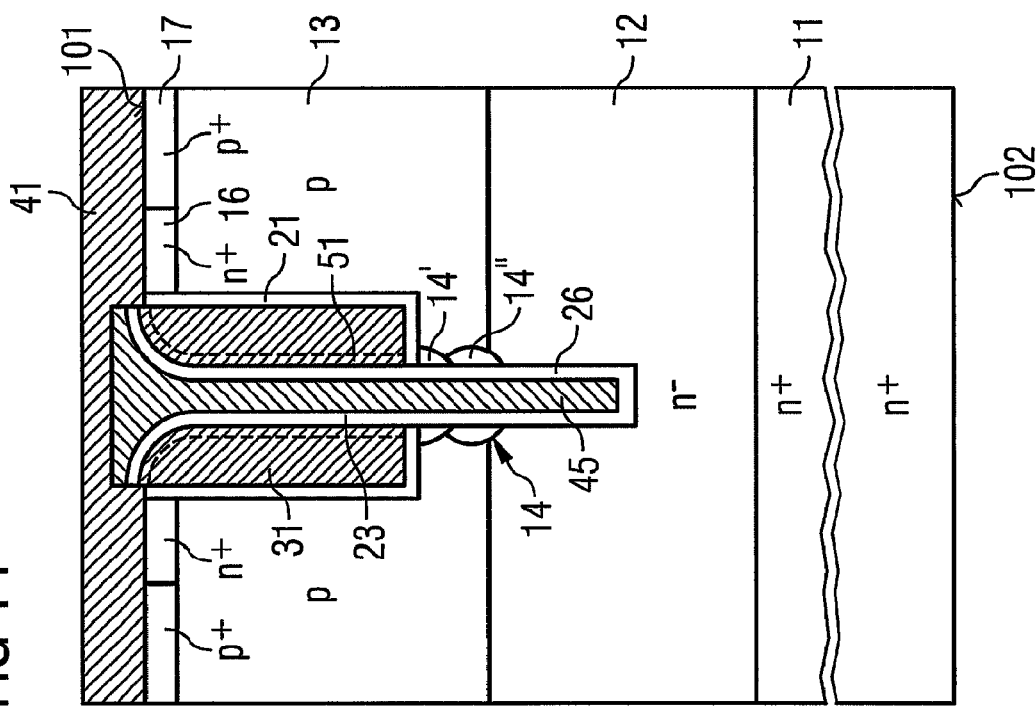
FIG. 14 illustrates a further method for producing a trench transistor in which a field electrode dielectrically insulated from the drift zone is produced.

In the case where the component is driven in the blocking state—that is to say when a drive potential suitable for forming an inversion channel is not present at the gate electrode—the field electrode 45 of the trench transistors in accordance with FIGS. 13D and 14 brings about a partial compensation of the dopant charge present in the first and second drift zone section 12, 14. The compensation, given the same dielectric strength of the component, enables a higher doping than in the case of a component without such a field electrode, which ultimately leads to a reduced on resistance of the component having the field electrode.

Figure 15C:
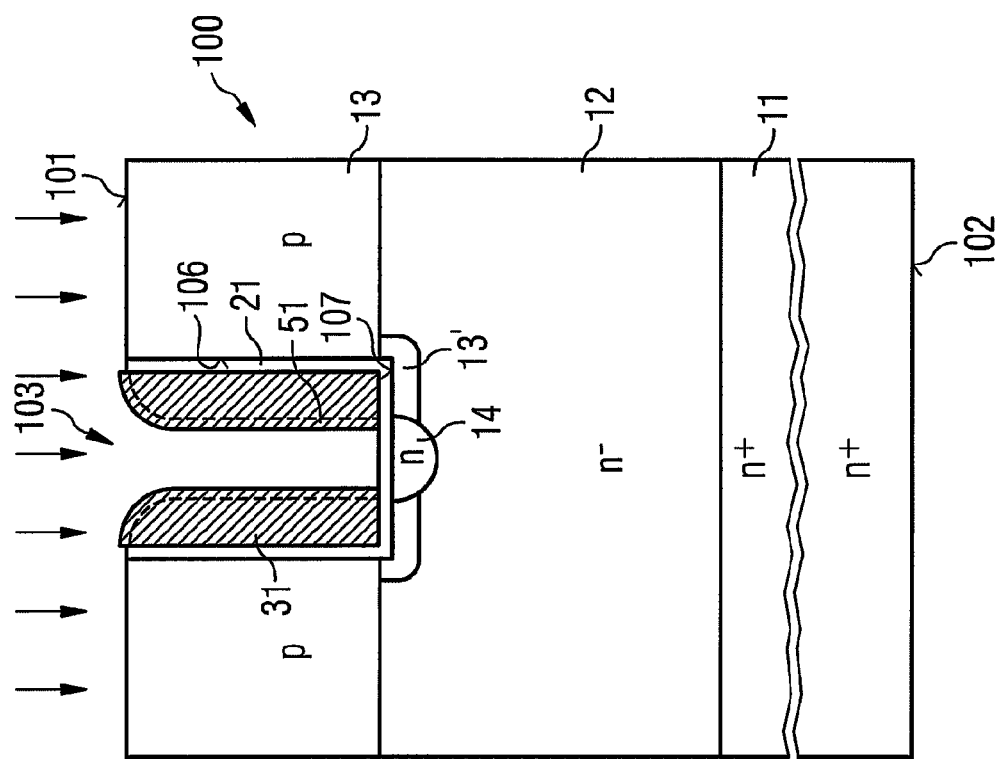
FIG. 15 illustrates a method for producing a trench transistor having a body zone with two body zone sections and a drift zone with two drift zone sections.

FIGS. 15A to 15C illustrate a method for producing the second drift zone section which is modified relative to the method in accordance with FIGS. 1 and 3. Referring to FIG. 15A this method involves producing the first trench 103 in such a way that it extends in the vertical direction proceeding from the front side 101 through the second semiconductor zone 13 right into the first semiconductor zone or the first drift zone section 12. By using an implantation or diffusion method, after producing the trench 103, dopant atoms of the second conduction type are introduced into the first semiconductor zone 12 via the trench bottom 107, whereby a doped semiconductor zone 13' of the second conduction type arises, which reaches as far as the second semiconductor zone 13. The trench sidewalls 106 and the trench bottom 107 are then initially completely surrounded by a semiconductor zone of the second conduction type, namely by the second semiconductor zone 13 and by the semiconductor zone 13' produced by introducing dopant atoms of the second conduction type.

Referring to FIG. 15B, spacers 31 are subsequently produced at the trench sidewalls 106. In a manner already explained, the the spacers 31 can completely or partly form the later gate electrode of the trench transistor. In this case, before the spacers 31 are produced, the gate dielectric layer 21 is produced at the trench sidewalls 106 and the trench bottom 107. This is illustrated as the result in FIG. 15B. A further spacer layer 51 can optionally be applied to the spacers 31, the layer being illustrated by dashed lines in FIG. 15B.

Figure 16:
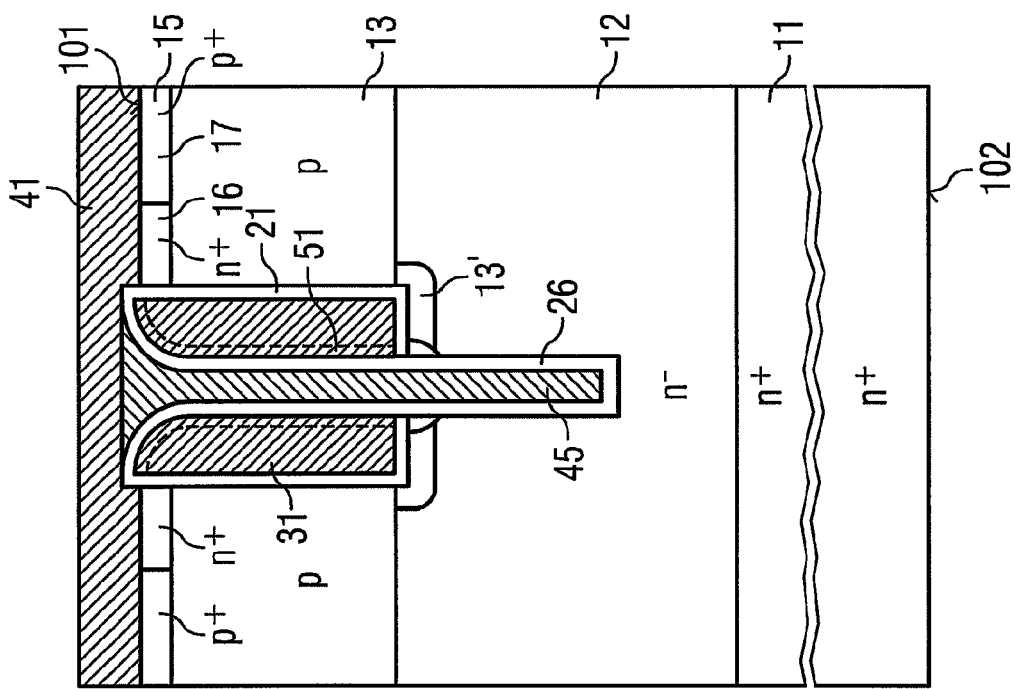
FIG. 16 illustrates, on the basis of a vertical cross section through a semiconductor body, a trench transistor with two body zone sections and two drift zone sections.

Referring to FIG. 15C, dopant atoms of the first conduction type are subsequently introduced into the semiconductor body 100 via that section of the trench bottom 107 which is left free by the spacers 31, whereby a doped semiconductor zone of the first conduction type arises, which forms the second drift zone section 14. The second drift zone section 14 extends from the trench bottom 107 right into or as far as the first drift zone section 12. The result of the method explained above is a component structure having two drift zone sections, a first drift zone section formed by the first semiconductor zone 12 and a second drift zone section 14 produced by the introduction of dopant atoms of the first conduction type, and having a body zone with two body zone sections, namely a first body zone section formed by the second semiconductor zone 13 and a second body zone section 13' formed by introducing dopant atoms of the second conduction type into the trench bottom 107. This component structure illustrated in FIG. 15C is suitable in a manner corresponding to the component structures in accordance with FIGS. 1C and 3 for realizing trench transistors as illustrated in FIGS. 3 to 7 and 13D, for example. The component structure illustrated with reference to FIG. 15 can therefore be combined with any of the previously explained gate electrode structures and field plate structures. In this connection FIG. 16 illustrates as an example a trench transistor having a field electrode 45 reaching right into the first drift zone section 12, which is realized on the basis of the component structure in accordance with FIG. 15C.

It was assumed for the explanation above that the spacers remain in the trench after the production of the second drift zone section 14 and at least partly form the later gate electrode of the component. It goes without saying that there is also the possibility, however, of removing the spacers after the production of the second drift zone section 14 and subsequently producing the gate electrode. A non-electrically conductive material can then also be used as material for the spacers.

A further method for producing a trench transistor structure with two drift zone sections is explained below with reference to FIGS. 17A and 17B. Referring to FIG. 17A, this method provides for producing a trench 203 in a semiconductor body 200, which trench, proceeding from a front side 201 of the semiconductor body, reaches through a second semiconductor zone 213 of a first conduction type right into a first semiconductor zone 212 of a first conduction type. In this case, the first semiconductor zone 212 forms a drift zone section of the later transistor. The first and second semiconductor zone 212, 213 are epitaxial layers, for example, which are arranged in a manner lying one above another in a vertical direction of the semiconductor body 200. In this case, the first semiconductor zone 12 can be arranged on a highly doped semiconductor substrate 211, as is illustrated in FIG. 17A. In a manner not specifically illustrated, there is also the possibility of realizing the first semiconductor zone 212 as a lightly doped semiconductor substrate, to which the second semiconductor zone 213 is applied as an epitaxial layer.

Referring to FIG. 17A, a field electrode 245 is produced in a lower region of the trench 203, the field electrode being insulated from the semiconductor body 200 by a field electrode dielectric 227. The field electrode 245 and the field plate dielectric 227 are produced, for example, by successively depositing a dielectric layer and an electrode layer and subsequently etching back the layers until only the field electrode 245 and the field plate dielectric 227 remain in the lower region of the trench 203. In this case, the field plate dielectric 227 can be realized in such a way that it reaches in the direction of the front side 201 of the semiconductor body as far as above an interface between the first and second semiconductor zone 212, 213. Furthermore, in an upper region of the trench, a protective layer 251 is applied to trench sidewalls of the trench. "Upper region of the trench" hereinafter denotes a region which is completely surrounded by the second semiconductor zone 213. The protective layer includes, for example, a nitride or an oxide and can form the later gate dielectric. After the protective layer 251 has been produced, dopant atoms are implanted into the field plate dielectric 227. This implantation can be effected by using two oblique implantations, for example, that is to say implantations in which an implantation direction forms an angle of less than 90 degrees with respect to the perpendicular. These two implantation directions are illustrated schematically by arrows in FIG. 17A. The dopant atoms implanted into the field plate dielectric 227 are implanted partly by lateral dispersion into the semiconductor body and/or subsequently indiffused into the semiconductor body by using a thermal process, whereby semiconductor zones 214 of the first conduction type arise in the region of an upper edge of the field plate dielectric 227, the semiconductor zones extending from the first semiconductor zone 212 right into the second semiconductor zone 213. The semiconductor zones 214 form a second drift zone section of the later trench transistor.

These method processes for producing the second drift zone section 214 are followed by further method processes known in principle for completing the trench transistor. The method processes comprise, for example, producing a gate dielectric 221 at the trench sidewalls and in the upper trench region, the protective layer 251 being removed before the gate dielectric layer 221 is produced. A gate electrode 230 is additionally produced within the upper trench region, the gate electrode being insulated from the semiconductor body by the gate dielectric 221. By using implantation or diffusion methods, source zones 216 are additionally produced in the region of the front side 201 of the semiconductor body, contact being made with the source zones by a source electrode 241. Highly doped connection zones 217 of the second conduction type can optionally be produced between the source electrode 241 and the second semiconductor zone 213, which forms the body zone of the trench transistor.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A method for producing an integrated circuit including a trench transistor having a drift zone and a body zone adjacent to the drift zone, the method comprising:

providing a semiconductor body having a first side and a first semiconductor zone of a first conduction type;

producing a first trench, which has trench sidewalls and a trench bottom and which extends into the semiconductor body proceeding from the first side;

producing at least one first spacer at the trench sidewalls which leaves free a section of the trench bottom;

producing a second semiconductor zone of a second conduction type complementary to the first conduction type, which second semiconductor zone is adjacent to the first semiconductor zone in the direction of the first side of the semiconductor body and extends in the direction of the first semiconductor zone as far as below the trench bottom;

producing at least one third semiconductor zone of the first conduction type by introducing dopant atoms via the left-free section of the trench bottom, the first and the at least one third semiconductor zone forming the drift zone and the second semiconductor zone forming the body zone at least in sections;

producing a further trench extending through the third semiconductor zone right into the first semiconductor zone proceeding from that section of the trench bottom of the first trench which is left free by the at least one first spacer; and producing a field electrode dielectrically insulated from the semiconductor body in the further trench.

2. The method of claim 1, wherein the spacer layer comprises an electrically conductive material and forms at least one part of the gate electrode.

3. The method of claim 2, comprising producing the field electrode in such a way that it is dielectrically insulated from the gate electrode.

* * * * *